(12) United States Patent
Kakuhari et al.

(10) Patent No.: US 7,174,324 B2
(45) Date of Patent: Feb. 6, 2007

(54) CRIMPING CONNECTION DESIGN SYSTEM USING MULTILAYER FEEDFORWARD NEURAL NETWORKS

(75) Inventors: Nobuhiro Kakuhari, Haibara-gun (JP); Naoki Ito, Haibara-gun (JP)

(73) Assignee: Yazaki Corporation, Tokyo (JP)

( * ) Notice: Subject to any disclaimer, the term of this patent is extended or adjusted under 35 U.S.C. 154(b) by 458 days.

(21) Appl. No.: 10/663,901

(22) Filed: Sep. 17, 2003

(65) Prior Publication Data

US 2004/0128009 A1 Jul. 1, 2004

(30) Foreign Application Priority Data

Sep. 17, 2002 (JP) ............... P2002-269739

(51) Int. Cl.
*G06E 1/00* (2006.01)
(52) U.S. Cl. ............... 706/16; 29/745; 29/747; 29/844; 29/857; 29/861; 72/21.4
(58) Field of Classification Search ............... 706/16; 29/745, 747, 861, 857, 844, 851; 72/21.4; 174/1–212
See application file for complete search history.

(56) References Cited

U.S. PATENT DOCUMENTS

| | | | | |
|---|---|---|---|---|
| 5,101,651 A | * | 4/1992 | Yeomans ............... | 72/21.4 |
| 5,197,186 A | * | 3/1993 | Strong et al. ........... | 29/863 |
| 5,271,254 A | * | 12/1993 | Gloe et al. ............. | 72/13.2 |
| 5,275,032 A | * | 1/1994 | Gloe et al. ............. | 72/19.8 |
| 5,669,257 A | * | 9/1997 | Inoue et al. ........... | 72/20.1 |
| 5,727,409 A | * | 3/1998 | Inoue et al. ........... | 72/21.1 |
| 5,887,469 A | * | 3/1999 | Maeda et al. ........... | 72/20.1 |
| 5,937,505 A | * | 8/1999 | Strong et al. ........... | 29/593 |
| 5,966,806 A | * | 10/1999 | Maeda et al. ........... | 29/863 |
| 6,067,828 A | * | 5/2000 | Bucher et al. .......... | 72/21.4 |
| 6,161,407 A | * | 12/2000 | Meisser ............... | 72/21.4 |
| 6,418,769 B1 | * | 7/2002 | Schreiner ............. | 72/21.4 |

FOREIGN PATENT DOCUMENTS

GB    2 337 346 A    11/1999

OTHER PUBLICATIONS

"Neural Network based Process Control of integrated Circuit Wire Bonding Machine", Khotanzad, A.; Elragal, H.; Kinnaird, C.; Neural Networks, 1999. IJCNN '99. International Joint Conference on, vol. 4, Jul. 10-16, 1999 pp. 2226-2229.*
"A New Method to Investigate Electrical Conduction in Crimp Joints, Influence of the Compaction Ratio and Electrical Model", Rosazza Prin, G.; Courtin, T.; Boyer, L.; Electrical Contacts, 2002. Proceedings of the Forty-Eighth IEEE Holm Conference on Oct. 21-23, 2002 pp. 246-251.*

* cited by examiner

*Primary Examiner*—David Vincent
*Assistant Examiner*—Mai T. Tran
(74) *Attorney, Agent, or Firm*—Sughrue Mion, PLLC

(57) ABSTRACT

Estimation sections which have beforehand learned a relationship between known connection data pertaining to connection design and unknown connection data pertaining to connection design for the known connection data estimate the unknown connection data for the known connection data in accordance wit an input of the known connection data, on the basis of the result of learning. The respective estimation sections are formed from a multilayer feedforward neural network in which layers constituted of a plurality of neurons are coupled together in a direction in which the layer runs from an input layer to an output layer by way of an intermediate layer.

16 Claims, 11 Drawing Sheets

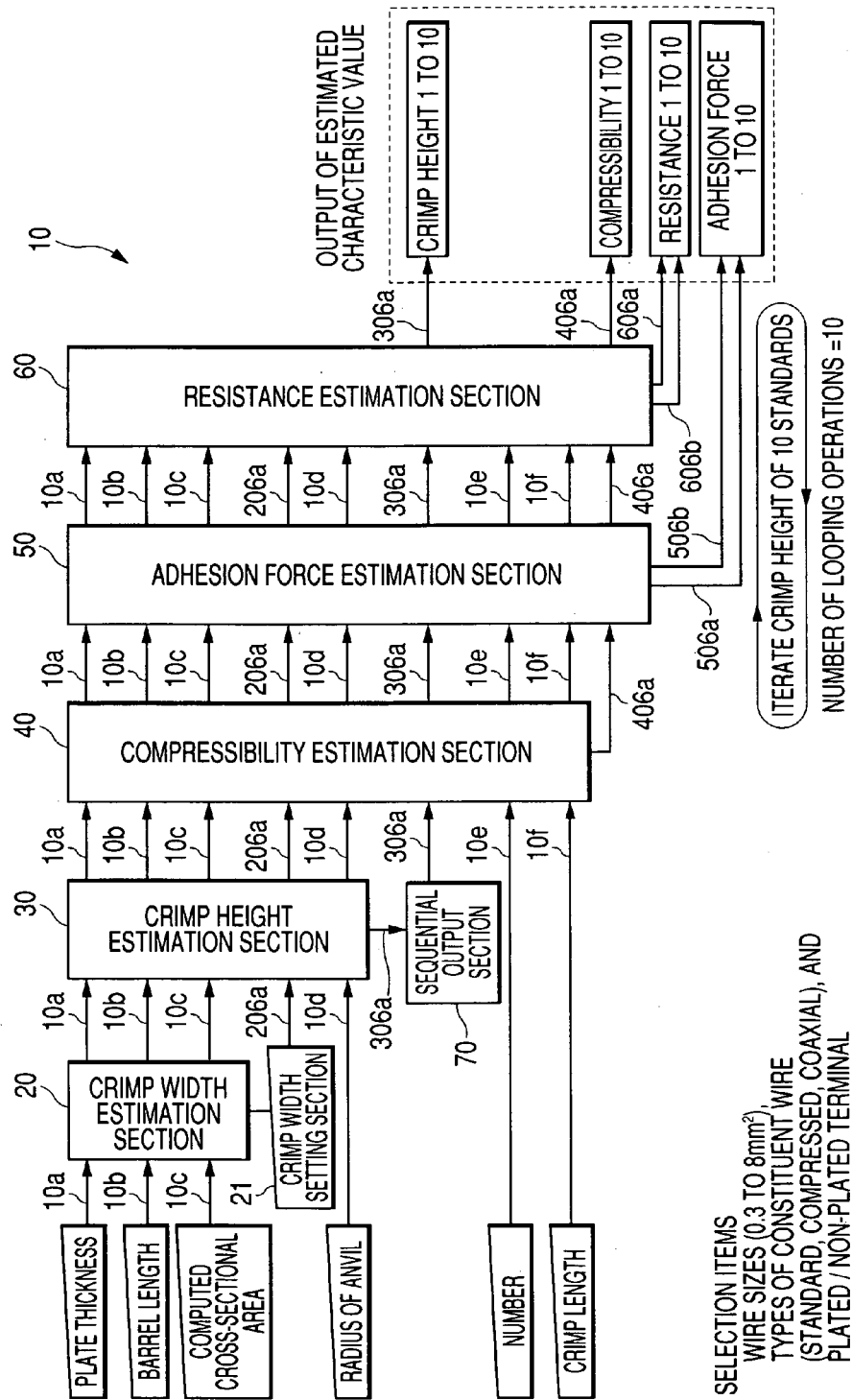

FIG. 5A

[REQUIREMENTS FOR ESTIMATION]

| | | LIMIT VALUES | | |
|---|---|---|---|---|
| WIRE TYPE | AVSS-f | TERMINAL "t" | 0.44mm | |
| WIRE SIZE (NOMINAL SIZE) | 0.75 | L1 | 8.00mm | |
| TERMINAL PLATING, PLATED | YES | A1 | 4.00mm | |
| NEURO ESTIMATION | | COMPUTED CROSS-SECTIONAL AREA | | 0.7895mm^2 |
| TYPE CRIMP WIDTH | 2.77mm | NUMBER OF CONSTITUENT WIRES | | 19ea |
| CRIMP HEIGHT | 1.44mm | RADIUS OF ANVIL | 2.40mm | |

FIG. 5B

[ESTIMATION RESULTS]

| NO. | CRIMP HEIGHT | COMPRESSIBILITY | ADHESION FORCE | RESISTANCE | CRIMP SHAPE |
|---|---|---|---|---|---|
| 1 | 1.19 | 66.09 | 11.75 | 0.07 | |
| 2 | 1.24 | 69.54 | 12.46 | 0.09 | |
| 3 | 1.29 | 73.34 | 13.14 | 0.12 | |
| 4 | 1.34 | 77.27 | 13.75 | 0.16 | |
| 5 | 1.39 | 82.31 | 14.27 | 0.19 | |
| 6 | 1.44 | 87.71 | 14.68 | 0.24 | |
| 7 | 1.49 | 93.90 | 14.94 | 0.31 | |
| 8 | 1.54 | 101.04 | 15.01 | 0.42 | |
| 9 | 1.59 | 109.26 | 14.70 | 0.61 | |
| 10 | 1.64 | 118.64 | 13.57 | 0.98 | |

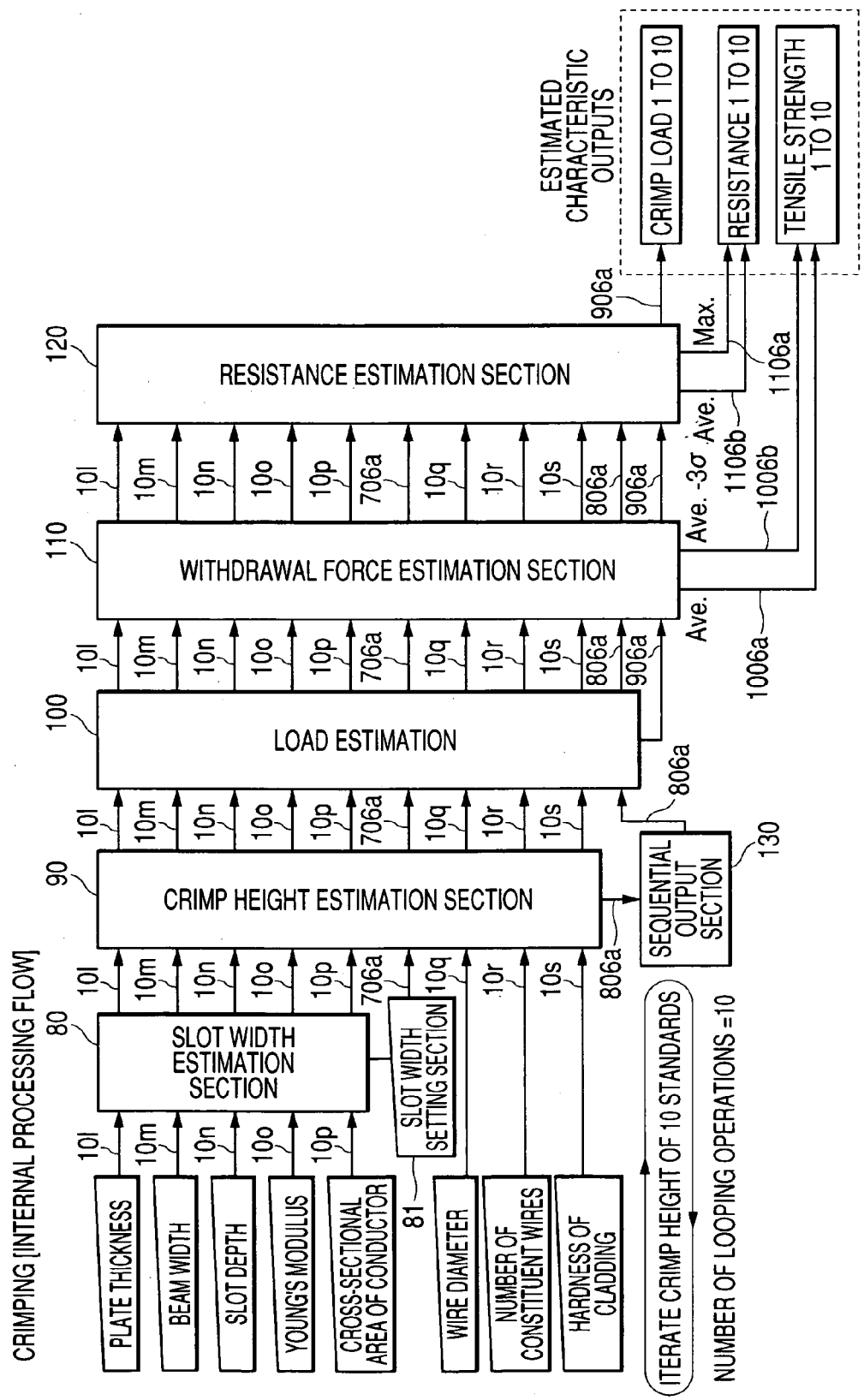

8 0 6 a ● → ● 8 0 6 a  (6)
(ONE ESTIMATED VALUE)

○ 8 0 6 a + p  (7)

○ 8 0 6 a + 2 p  (8)

○ 8 0 6 a + 3 p  (9)

○ 8 0 6 a + 4 p  (10)

p: INTERVAL   0.05 (0.1) mm

CRIMPING CONNECTION DESIGN SYSTEM USING MULTILAYER FEEDFORWARD NEURAL NETWORKS

BACKGROUND OF THE INVENTION

The invention relates to a design support system, and more particularly, to a design support system which preliminarily estimates unknown connection data prior to actual connection of a conductor to a connector terminal, to thereby support the design of a connection.

A method for caulking and crimping a conductor by means of, e.g., a barrel provided on a connector terminal, and a method for press-fitting a conductor sheathed with an insulation cladding into a slot formed in the connector terminal have hitherto been available as a method for electrically connecting a conductor to a connector terminal.

First, a method for connecting a conductor to a connector terminal by means of crimping will now be described. The connector terminal used for crimping connection usually assumes constructions such as shown those in FIGS. 2A and 2B. As illustrated, a connector terminal 12 has a conductor barrel 12A and an insulator barrel 12B.

As shown in FIGS. 2C and 2D, the previously-described conductor barrel 12A and the previously-described insulator barrel 12B of the connector terminal 12 and a conductor 11A are crimped with a crimper 14A and an anvil 13. Subsequently, pressure is applied to the conductor barrel 12A, the insulator barrel 12B, and the conductor 11A, whereby the conductor 11A is caulked and crimped with the conductor barrel 12A. Further, an insulation cladding 11B sheathing the conductor 11A is caulked and crimped (as shown in FIG. 213) with the insulator barrel 12B, whereby the connector terminal 12 is connected to the conductor 11A in the manner shown in FIG. 2F.

FIG. 11 shows relationships existing between the height of a crimp C/H (see FIG. 2F) achieved after crimping, and adhesion force $F_1$ and contact resistance $R1$ existing between the crimped conductor 11A and the connector terminal 12.

As illustrated, the adhesion force $F_1$ possesses an upwardly-bulging nonlinear characteristic with respect to the crimp height C/H. Hence, the adhesion force $F_1$ is considered to be usable within a given range of the crimp height C/H. Similarly, the contact resistance $R_1$ possesses a rightwardly-climbing nonlinear characteristic with respect to the crimp height C/H. Therefore, the contact resistance $R_1$ is considered to be usable within a given range of crimp height C/H. In view of a relationship between the adhesion force $F_1$ and the contact resistance $R_1$, which have these nonlinear characteristics with respect to crimp height, the range of crimp height C/H (i.e., an optimal crimp height shown in FIG. 11) for which the adhesion force $F_1$ and the contact resistance $R_1$ can be used is limited.

When a new connection is designed, the conductor 11A, the connector terminal 12, and the anvil 13 or the crimper 14 have hitherto been designed. After crimp connection has been actually effected through use of the thus-designed conductor 11A, the connector terminal 12, and the anvil 13/crimper 14A, the crimp height C/H, the adhesion force $F_1$, and the contact resistance $R_1$ are measured. An evaluation is made as to whether or not the crimp height C/H—at which optimal adhesion force $F_1$ and contact resistance $R_1$ are to be achieved—is obtained. If the crimp height C/H is not obtained, the foregoing operations are again repeated after a new conductor 11A, a new connector terminal 12, and anew anvil 13/new crimper 14 have been designed.

Next, a method for connecting a conductor to a connector terminal through press-fitting (pressure-welding) will be described. A connector terminal used for press-fitting connection usually assumes a configuration such as that shown in FIG. 8. As illustrated, the connector terminal 12 has an electrical connection section 12C having a pair of pressure-welding blades (FIG. 8A shows a single pressure-welding blade, and FIG. 8B shows two pressure-welding blades).

A slot 12D is formed between the pair of pressure-welding blades. The width W of the slot is designed to become narrower than the outer diameter of the conductor 11A sheathed with the insulation cladding 11B. When the conductor 11A sheathed with the insulation cladding 11B is press-fitted into the slot 12D, the insulation cladding 11B is broken with the pressure-welding blades, whereupon the pressure-welding blades come into contact with the conductor 11A, and the connector terminal 12 is connected to the conductor 11A.

When the slot width W is made constant, there are achieved relationships between the crimp height "l" achieved after press-fitting, and drawing force $F_2$ and contact resistance $R_{21}$, $R_{22}$ ($R_{21}$ denotes the maximum contact resistance, and $R_{22}$ denotes mean contact resistance) existing between the conductor 11A and the connector terminal 12, such as those shown in FIG. 10A. When the crimp height "l" is made constant, there are achieved relationships between the slot width W obtained before press-fitting and the drawing force $F_2$ and contact resistance $R_{21}$, $R_{22}$ existing between the press-fitted conductor 11A and the connector terminal 12, such as those shown in FIG. 10B.

As illustrated, the drawing force $F_2$ has an upwardly concave nonlinear characteristic with respect to the crimp height "l" and the slot width W. Hence, the drawing force $F_2$ is considered to be usable within a given range of the crimp height "l" and that of the slot width W. Similarly, the contact resistances $R_{21}$, $R_{22}$ possess the rightwardly-climbing nonlinear characteristics with respect to the crimp height "l" and the slot width W. Hence, the contact resistances $R_{21}$, $R_{22}$ are considered to be usable within a given range of crimp height "l" and that of the slot width W.

In view of the relationships between the drawing force $F_2$ and the contact resistance $R_{21}$, $R_{22}$, all having the nonlinear characteristics, the range of the crimp height "l" and that of the slot width W (i.e., an optimal crimp height and an optimal slot width shown in FIG. 10) in which the drawing force $F_2$ and the contact resistances $R_{21}$, $R_{22}$ are usable is limited.

For instance, when a new connection is designed, the conductor 11A and the connector terminal 12 are conventionally designed. After press-fitting connection has actually been effected through use of the thus-designed conductor 11A and the connector terminal 12, the crimp height "l," the slot width W, the drawing force $F_1$, and the contact resistance $R_1$ are measured. An evaluation is made as to whether or not the crimp height "l" and the slot width W—at which the optimal drawing force $F_1$ and the optimal contact resistances $R_{21}$, $R_{22}$ are achieved—is obtained. When not obtained, the foregoing operations are repeated after the conductor 11A and the connector terminal 12 have been newly designed.

However, the conventional design of connection between the conductor and the connector terminal involves a necessity for achieving an optimal connection by iteration of trial and error operations, such as the aforementioned design, actual connection, and evaluation. Therefore, when a person who is less experienced in design attempts to design a connection, there arises consumption of a longer time until a desired connections implemented. This in turn renders a design period longer and adds to design costs.

SUMMARY OF THE INVENTION

The invention focuses attention on these drawbacks. The challenge to be met by the invention is to provide a design support system capable of affording support so that any designer can readily design connection between a conductor and a connector terminal without depending on the designer's experience and within a short period of time.

An invention of an aspect 1 conceived to solve the previously-described drawback is directed toward a design support system for supporting the design of a connection between a conductor and a connector terminal, comprising an estimation unit for learning beforehand a relationship between known connection data pertaining to connection design and unknown connection data pertaining to the connection design for the known connection data, wherein the estimation unit estimates the unknown connection data for the known connection data in accordance with an input of the known connection data on the basis of the result of learning.

According to the invention of the aspect 1, the estimation unit that has learned a relationship between known connection data pertaining to connection design and unknown connection data pertaining to connection design for the known connection data estimates the unknown connection data for the known connection data on the basis of the result of learning in accordance with an input of the known connection data. Therefore, the estimation unit estimates the unknown connection data in accordance with the input of known connection data, whereby a designer can ascertain a rough value of the unknown connection data without actually connecting a conductor to a connector in accordance with the connection data.

An invention of an aspect 2 is characterized by the design support system of claim 1, wherein the estimation unit is constituted of a multilayer feedforward neural network in which layers formed from a plurality of neurons are coupled together in a direction in which the layers run from an input layer to an output layer by way of an intermediate layer.

According to the invention of the aspect 2, the estimation unit is formed from a multilayer feedforward neural network in which layers formed from a plurality of neurons are coupled together in a direction in which the layers run from an input layer to an output layer by way of an intermediate layer. Accordingly, use of a multilayer feedforward neural network having a superior learning feature enables accurate estimation of unknown connection data.

An invention of an aspect 3 is characterized by the design support system of the aspect 1 or 2, wherein, when the conductor and the connector terminal are connected together through crimping, the estimation unit performs learning beforehand while taking, as unknown connection data, any of the crimp width and the crimp height, both being obtained after crimping, a compressibility of the conductor in a direction of the crimp height, adhesion force existing between the conductor and the connector terminal, and contact resistance existing between the conductor and the connector terminal.

According to the invention of an aspect 3, any of the crimp width and the crimp height, both being obtained after crimping, a compressibility of the conductor in a direction of the crimp height, adhesion force existing between the conductor and the connector terminal, and contact resistance existing between the conductor and the connector terminal is estimated as unknown connection data in accordance with the input of known connection data, thereby supporting the design of a connection. As a result, the designer can ascertain a rough value of the unknown connection data without actually connecting a conductor to a connector in accordance with the connection data.

An invention of an aspect 4 is characterized by the design support system of the aspect 1 or 2, wherein the estimation unit further comprises a C/W estimation unit which, when the conductor and the connector terminal are connected together by means of crimping, performs learning beforehand while taking the crimp width obtained after crimping as the unknown connection data and produces crimp width data by estimating the crimp width in accordance with an input of the known connection data required for estimating the crimp width; and a C/H estimation unit which performs learning beforehand while taking the crimp height obtained after crimping as the unknown connection data and produces crimp height data by estimating the crimp height in accordance with an input of the known connection data required for estimating the crimp height, wherein the crimp width data produced by the C/W estimation unit are input to the C/H estimation unit as at least a portion of the known connection data required for estimating the crimp height.

According to the invention of the aspect 4, the C/W estimation unit of the estimation unit performs learning beforehand while taking the crimp width obtained after crimping as unknown connection data and estimates a crimp width in accordance with an input of the known connection data required for estimating the crimp width, thereby producing crimp width data. The C/H estimation unit performs learning beforehand while taking the crimp height obtained after crimping as the unknown connection data and estimates the crimp height in accordance with an input of the known connection data required for estimating the crimp height, thereby producing crimp height data. Further, the crimp width data produced by the C/W estimation unit are input to the C/H estimation unit as at least a portion of the known connection data required for estimating the crimp height.

Therefore, the C/W estimation unit estimates the crimp width obtained after crimping in accordance with an input of known connection data, and the C/H estimation unit estimates the crimp height obtained after crimping in accordance with the input of known connection data. As a result, the designer can ascertain a rough value of a crimp width and that of a crimp height without actually connecting a conductor to a connector in accordance with the connection data. Further, the crimp width data produced by the C/W estimation unit are input to the C/H estimation unit as at least a portion of the known connection data required to estimate a crimp height. Hence, the designer does not need to estimate a crimp width and input the thus-estimated crimp width to the C/H estimation unit.

An invention of an aspect 5 is characterized by the design support system of the aspect 4, wherein the estimation unit further comprises a compressibility estimation unit which performs learning beforehand while taking a compressibility of a conductor in the direction of a crimp height obtained after crimping as the unknown connection data and which produces compressibility data by estimating the compressibility in accordance with an input of the known connection data required for estimating the compressibility, wherein the crimp width data produced by the C/W estimation unit and the crimp height data produced by the C/H estimation unit are input to the compressibility estimation unit as at least a portion of the known connection data required for estimating the compressibility.

According to the invention of the aspect 5, the compressibility estimation unit of the estimation unit performs learning beforehand while taking the compressibility obtained after crimping as the unknown connection data and produces compressibility data by estimating the compressibility in accordance with an input of the known connection data required for estimating the compressibility. Further, the crimp width data produced by the C/W estimation unit and the crimp height data produced by the C/H estimation unit are input to the compressibility estimation unit as at least a portion of the known connection data required for estimating the compressibility.

Therefore, the compressibility estimation unit estimates the compressibility obtained after crimping in accordance with an input of known connection data, whereby the designer can ascertain a rough value of a compressibility without actually connecting a conductor to a connector in accordance with the connection data. Further, the crimp width data produced by the C/W estimation unit and the crimp height data produced by the C/H estimation unit are input to the compressibility estimation unit as at least a portion of the known connection data required for estimating the compressibility, thereby obviating a necessity for the designer to estimate the crimp width and the crimp height and input the thus-estimated crimp width and the crimp height to the compressibility estimation unit.

An invention of an aspect 6 is characterized by the design support system of the aspect 5, wherein the estimation unit further comprises an adhesion force estimation unit which performs learning beforehand while taking adhesion force existing between the conductor and the connector terminal after crimping as the unknown connection data and which produces adhesion force data by estimating the adhesion force in accordance with an input of the known connection data required for estimating the adhesion force, wherein the crimp width data produced by the C/W estimation unit, the crimp height data produced by the C/H estimation unit, and the compressibility data produced by the compressibility estimation unit are input to the adhesion force estimation unit as at least a portion of the known connection data required for estimating the adhesion force.

According to the invention of the aspect 6, the adhesion force estimation unit of the estimation unit performs learning beforehand while taking the adhesion force obtained after crimping as the unknown connection data and produces adhesion force data by estimating the adhesion force in accordance with an input of the known connection data required for estimating the adhesion force. Further, the crimp width data produced by the C/W estimation unit, the crimp height data produced by the C/H estimation unit, and the compressibility data estimated by the compressibility estimation unit are input to the adhesion force estimation unit as at least a portion of the known connection data required for estimating the adhesion force.

Therefore, the adhesion force estimation unit estimates the adhesion force obtained after crimping in accordance with an input of known connection data, whereby the designer can ascertain a rough value of adhesion force without actually connecting a conductor to a connector in accordance with the connection data. Further, the crimp width data produced by the C/W estimation unit, the crimp height data produced by the C/H estimation unit, and the compressibility data estimated by the compressibility estimation unit are input to the adhesion force estimation unit as at least a portion of the known connection data required for estimating the compressibility, thereby obviating a necessity for the designer to estimate the crimp width, the crimp height, and the compressibility and input the thus-estimated crimp width, crimp height, and compressibility to the compressibility estimation unit.

An invention of an aspect 7 is characterized by the design support system of the aspect 5, wherein the estimation unit further comprises resistance estimation unit which performs learning beforehand while taking contact resistance existing between the conductor and the connector terminal after crimping as the unknown connection data and which produces contact resistance data by estimating the contact resistance in accordance with an input of the known connection data required for estimating the contact resistance, wherein the crimp width data produced by the C/W estimation unit, the crimp height data produced by the C/H estimation unit, and the compressibility data produced by the compressibility estimation unit are input to the resistance estimation unit as at least a portion of the known connection data required for estimating the contact resistance.

According to the invention of the aspect 7, the resistance estimation unit of the estimation unit performs learning beforehand while taking the contact resistance obtained after crimping as the unknown connection data and produces contact resistance data by estimating the contact resistance in accordance with an input of the known connection data required for estimating the contact resistance. Further, the crimp width data produced by the C/W estimation unit, the crimp height data produced by the C/H estimation unit, and the compressibility data estimated by the compressibility estimation unit are input to the resistance estimation unit as at least portions of the known connection data required to estimate the contact resistance.

Therefore, the resistance estimation unit estimates the contact resistance obtained after crimping in accordance with an input of known connection data, whereby the designer can ascertain a rough value of contact resistance without actually connecting a conductor to a connector in accordance with the connection data. Further, the crimp width data produced by the C/W estimation unit, the crimp height data produced by the C/H estimation unit, and the compressibility data estimated by the compressibility estimation unit are input to the resistance estimation unit as at least a portion of the known connection data required for estimating the compressibility, thereby obviating a necessity for the designer to estimate the crimp width, the crimp height, and the compressibility and input the thus-estimated crimp width, crimp height, and compressibility to the resistance estimation unit.

An invention of an aspect 8 is characterized by the design support system according to any one of claims 4 through 7, further comprising input unit for manually inputting crimp width data to be input to the estimation unit as the known connection data so as to become equal to the crimp width data produced by the C/H estimation unit.

According to the invention of the aspect 8, the crimp width data to be input to the estimation unit as the known connection data so as become equal to the crimp width data produced by the C/H estimation unit can be manually input through use of the input unit. Accordingly, the unknown connection data can be estimated through use of the manually-input crimp width data.

An invention of an aspect 9 is characterized by the design support system of any one of the aspect 5 through 8, further comprising a sequential output unit which sequentially outputs, as the crimp height data, the crimp height data and a predetermined number of discrete values existing in a predetermined range centered on the crimp height in accordance with an input of the crimp height data produced by the C/H estimation unit.

According to the invention of an aspect 9, the C/H estimation unit can estimate the compressibility, adhesion force, and contact resistance corresponding to the crimp height data produced by the C/H estimation unit and a plurality of discrete values centered on the crimp height data, so long as the crimp height data are input to the compressibility estimation unit, the adhesion force estimation unit, or the resistance estimation unit by way of the sequential output unit. Consequently, the sequential output unit automatically inputs the discrete values centered on the crimp height data produced by the C/H estimation unit without the designer entering the discrete values into the compressibility estimation unit, the adhesion force estimation unit, or the resistance estimation unit.

An invention of an aspect 10 is characterized by the design support system of the aspect 1 or 2, wherein, when the conductor sheathed with an insulation cladding is connected to a slot formed in the connector terminal through press-fitting, the estimation unit performs learning beforehand while taking any of the slot width obtained before press-fitting, a crimp height representing a height from a base of the slot to the center of the conductor obtained after press fitting, load exerted on the conductor, withdrawal force exerted between the conductor and the connector terminal, and contact resistance existing between the conductor and the connector is taken as unknown connection data are taken as the unknown connection data.

According to the invention of an aspect 10, any of the slot width obtained before press-fitting, a crimp height representing a height from a base of the slot to the center of the conductor obtained after press fitting, load exerted on the conductor, withdrawal force exerted between the conductor and the connector terminal, and contact resistance existing between the conductor and the connector is estimated as unknown connection data in accordance with an input of known connection data, thereby supporting the design of a connection. As a result, the designer can ascertain a rough value of the unknown connection data without actually connecting a conductor to a connector in accordance with the connection data.

An invention of an aspect 11 is characterized by the design support system of the aspect 1 or 2, wherein, when the conductor sheathed with an insulation cladding is connected to and press-fitted into the slot formed in the connector terminal, the estimation unit further comprises a slot width estimation unit which performs learning beforehand while taking the slot width obtained before press-fitting as the unknown connection data and which produces slot width data by estimating the slot width in accordance with an input of the known connection data required for estimating the slot width; and a crimp height estimation unit which performs learning beforehand while taking the crimp height corresponding to a height from the base of the slot to the center of the conductor obtained after crimping as the unknown connection data and which produces crimp height data by estimating the crimp height in accordance with an input of the known connection data required for estimating the crimp height, wherein the slot width data produced by the slot width estimation unit are input to the crimp height estimation unit as at least a portion of the known connection data required for estimating the crimp height.

According to the invention of an aspect 11, the slot width estimation unit of the estimation unit performs learning beforehand while taking the slot width obtained before press-fitting as the unknown connection data and produces slot width data by estimating the slot width in accordance with an input of the known connection data required for estimating the slot width. The crimp height estimation unit performs learning beforehand while taking the crimp height obtained after crimping as the unknown connection data and produces crimp height data by estimating the crimp height in accordance with an input of the known connection data required for estimating the crimp height. Further, the slot width data produced by the slot width estimation unit are input to the crimp height estimation unit as at least a portion of the known connection data required for estimating the crimp height.

Therefore, the slot width estimation unit estimates the slot width obtained before crimping in accordance with an input of known connection data. The crimp height estimation unit estimates a crimp height obtained after press-fitting in accordance with an input of known connection data. As a result, the designer can ascertain a rough value of a slot width and that of a crimp height without actually connecting a conductor to a connector in accordance with the connection data. Further, the slot width data produced by the slot width estimation unit are input to the crimp height estimation unit as at least a portion of the known connection data required for estimating the crimp height, thereby obviating a necessity for the designer to estimate the slot width and input the thus-estimated slot width to the crimp height estimation unit.

An invention of an aspect 12 is characterized by the design support system of the aspect 11, wherein the estimation unit further comprises a load estimation unit which performs learning beforehand while taking load exerted on the conductor after press-fitting as the unknown connection data and which produces load data by estimating the load in accordance with an input of the known connection data required for estimating the load, wherein the slot width data produced by the slot width estimation unit and the crimp height data produced by the crimp height estimation unit are input to the load estimation unit as at least a portion of the known connection data required for estimating the load.

According to the invention of an aspect 12, the load estimation unit of the load estimation unit performs learning beforehand while taking the load obtained after press-fitting as the unknown connection data and produces load data by estimating the load in accordance with an input of the known connection data required for estimating the load. Further, the slot width data produced by the slot width estimation unit and the crimp height data produced by the crimp height estimation unit are input to the load estimation unit as at least a portion of the known connection data required for estimating the load.

Therefore, the load estimation unit estimates the load obtained after press-fitting in accordance with an input of known connection data. As a result, the designer can ascertain a rough value of the load without actually connecting a conductor to a connector in accordance with the connection data. Further, the slot width data produced by the slot width estimation unit and the crimp height data produced by the crimp height estimation unit are input to the load estimation unit as at least a portion of the known connection data required for estimating the load, thereby obviating a necessity for the designer to estimate the slot width and the crimp height and input the thus-estimated slot width and the crimp height to the load estimation unit.

An invention of an aspect 13 is characterized by the design support system of the aspect 12, wherein the estimation unit further comprises a withdrawal force estimation unit which performs learning beforehand while taking withdrawal force exerted between the conductor and the connector terminal after press-fitting as the unknown connection data and which produces withdrawal force data by estimating the withdrawal force in accordance with an input of the known connection data required for estimating the withdrawal force, wherein the slot width data produced by the slot width estimation unit, the crimp height data produced by the crimp height estimation unit, and the load data produced by the load estimation unit are input to the withdrawal force estimation unit as at least a portion of the known connection data required for estimating the withdrawal force.

According to the invention of the aspect 13, the withdrawal force estimation unit of the estimation unit performs learning beforehand while taking the withdrawal force obtained after press-fitting as the unknown connection data and produces withdrawal force data by estimating the withdrawal force in accordance with an input of the known connection data required for estimating the withdrawal force. Further, the slot width data produced by the slot width estimation unit, the crimp height data produced by the crimp height estimation unit, and the load data produced by the load estimation unit are input to the withdrawal force estimation unit as at least a portion of the known connection data required for estimating the withdrawal force.

Therefore, the withdrawal force estimation unit estimates the withdrawal force obtained after press-fitting in accordance with an input of known connection data. As a result, the designer can ascertain a rough value of the withdrawal force without actually connecting a conductor to a connector in accordance with the connection data. Further, the slot width data produced by the slot width estimation unit, the crimp height data produced by the crimp height estimation unit, and the load data produced by the load estimation unit are input to the withdrawal force estimation unit as at least a portion of the known connection data required for estimating the withdrawal force, thereby obviating a necessity for the designer to estimate the slot width, the crimp height, and the load and input the thus-estimated slot width, the crimp height, and the load to the withdrawal force estimation unit.

An invention of an aspect 14 is characterized by the design support system of the aspect 12, wherein the estimation unit further comprises resistance estimation unit which performs learning beforehand while taking contact resistance existing between the conductor and the connector terminal after press-fitting as the unknown connection data and which produces contact resistance data by estimating the contact resistance in accordance with an input of the known connection data required for estimating the contact resistance, wherein the slot width data produced by the slot width estimation unit, the crimp height data produced by the crimp height estimation unit, and the load data produced by the load estimation unit are input to the contact resistance estimation unit as at least a portion of the known connection data required for estimating the contact resistance.

According to the invention of an aspect 14, the resistance estimation unit of the estimation unit performs learning beforehand while taking the contact resistance obtained after press-fitting as the unknown connection data and produces contact resistance data by estimating the contact resistance in accordance with an input of the known connection data required for estimating the contact resistance. Further, the slot width data produced by the slot width estimation unit, the crimp height data produced by the crimp height estimation unit, and the load data produced by the load estimation unit are input to the resistance estimation unit as at least a portion of the known connection data required for estimating the contact resistance.

Therefore, the resistance estimation unit estimates the contact resistance obtained after press-fitting in accordance with an input of known connection data. As a result, the designer can ascertain a rough value of the contact resistance without actually connecting a conductor to a connector in accordance with the connection data. Further, the slot width data produced by the slot width estimation unit, the crimp height data produced by the crimp height estimation unit, and the load data produced by the load estimation unit are input to the resistance estimation unit as at least a portion of the known connection data required for estimating the contact resistance, thereby obviating a necessity for the designer to estimate the slot width, the crimp height, and the load and input the thus-estimated slot width, the crimp height, and the load to the resistance estimation unit.

An invention of an aspect 15 is characterized by the design support system according to any one of claims 11 to 14, further comprising an input unit for manually inputting slot width data to be input to the estimation unit as the known connection data so as to become equal to the slot width data produced by the slot width estimation unit.

According to the invention of the aspect 15, the slot width data to be input to the estimation unit as the known connection data so as to become equal to the slot width data produced by the slot width estimation unit can be manually input through use of the input unit. Consequently, the unknown connection data can be estimated through use of the manually-input slot width data.

An invention of an aspect 16 is characterized by the design support system of any one of the aspects 12 through 15, further comprising a sequential output unit which sequentially outputs, as the crimp height data, the crimp height data and a predetermined number of discrete values existing in a predetermined range centered on the crimp height data in accordance with an input of the crimp height data produced by the crimp height estimation unit.

According to the invention of an aspect 16, the crimp height estimation unit can estimate the load, withdrawal force, and contact resistance corresponding to the crimp height data produced by the C/H estimation unit and to a plurality of discrete values centered on the crimp height data, so long as the crimp height data are input to the load estimation unit, the withdrawal force estimation unit, or the resistance estimation unit by way of the sequential output unit. Consequently, the sequential output unit automatically inputs the discrete values centered on the crimp height data produced by the C/H estimation unit without the designer entering the discrete values into the load estimation unit, the withdrawal force estimation unit, or the resistance estimation unit.

An invention of an aspect 17 is characterized by the design support system of any one of the aspects 11 through 15, further comprising a sequential output unit which sequentially outputs, as the slot width data, the slot width data and a predetermined number of discrete values existing in a predetermined range centered on the slot width data in accordance with an input of the slot width data produced by the slot width estimation unit.

According to the invention of the aspect 17, the slot width estimation unit can estimate the crimp height, the load, withdrawal force, and contact resistance corresponding to the slot width data produced by the slot width estimation unit and to a plurality of discrete values centered on the slot width data, so long as the slot width data are input to the crimp height estimation unit, the load estimation unit, the withdrawal force estimation unit, or the resistance estimation unit by way of the sequential output unit. Consequently, the sequential output unit automatically inputs the discrete values centered on the slot width data produced by the slot width estimation unit without the designer entering the discrete values into the crimp height estimation unit, the load estimation unit, the withdrawal force estimation unit, or the resistance estimation unit.

An invention of an aspect 18 is characterized by the design support system of any one of the aspects 1 through 17, further comprising a sequential output unit which sequentially outputs, as the known connection data, the known connection data and a predetermined number of discrete values existing in a predetermined range centered on the known connection data in accordance with an input of the connection data.

According to the invention of an aspect 18, the sequential output unit sequentially outputs, as known connection data, known connection data and a predetermined number of discrete values within a predetermined range centered on the known connection data in accordance with an input of known connection data. Hence, the input known connection data and the unknown connection data corresponding to the discrete values centered on the known connection data can be automatically obtained without the designer entering the connection data and the discrete values centered on the connection data.

BRIEF DESCRIPTION OF THE DRAWINGS

FIG. 1 is a view showing a first embodiment of a design support system of the invention;

FIG. 5A shows an example of known connection data to be input to the design support system shown in FIG. 1;

FIG. 5B is a view showing a result of estimation performed by the design support system shown in FIG. 1;

FIG. 7 is a view showing a second embodiment of the design support system of the invention;

FIG. 9 is a view for describing an output from a sequential output section 130;

DETAILED DESCRIPTION OF PREFERRED EMBODIMENTS

First Embodiment

Figure 2E:
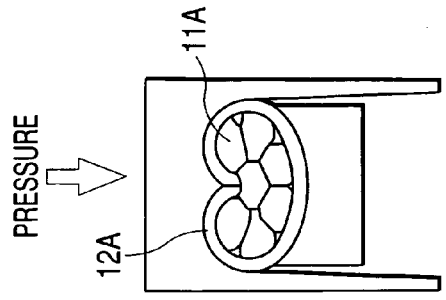
FIG. 2E is a view showing adhesion force.
Figure 2F:
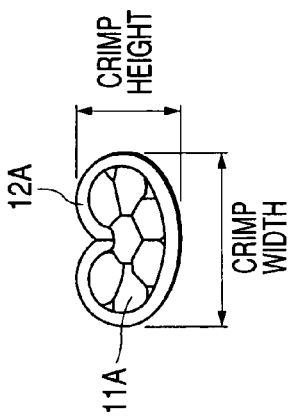
FIG. 2F is a view showing a state achieved after the connector terminal 12 and a conductor 11A have been crimped together.
Figure 2C:
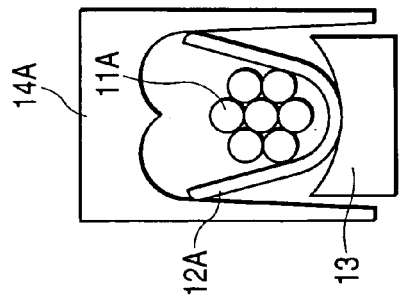
FIGS. 2C and 2D are views showing the shape of an anvil 13 and that of a crimper 14A, which are used for crimping operation.
Figure 2D:
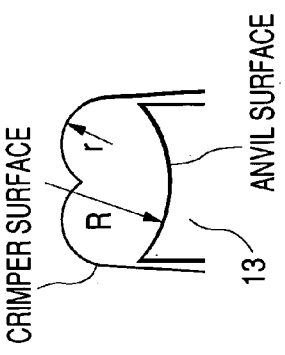
Figure 2A:
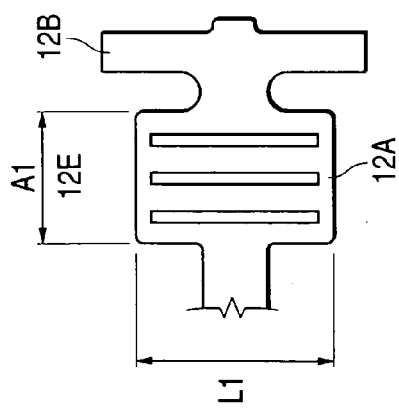
FIG. 2A is a developed view and FIG. 2B is a side view, both showing the shape of a connector terminal 12 used for crimping connection.
Figure 2B:
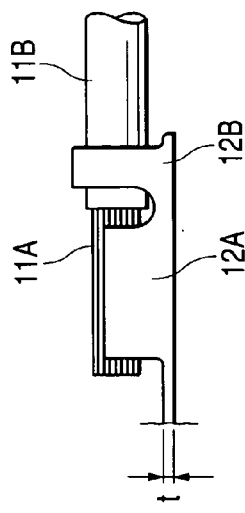

A first embodiment of the invention will be described by reference to the drawings. FIG. 1 is a view showing a first embodiment of a design support system 10 of the invention. As shown in FIGS. 2A to 2F, the design support system 10 is a system for supporting the design of connection by preliminarily estimating connection data pertaining to the design of unknown connection parameters, such as a crimp width C/W, a crimp height C/H, the compressibility of the conductor 11A in a crimping direction, and adhesion force and contact resistance existing between the conductor 11A and the connector terminal 12, prior to actual crimp connection of the conductor 11A, such as a wire or cable, to the connector terminal 12.

As illustrated, the design support system 10 has a C/W estimation section 20 (i.e., C/W estimation unit) formed from a multilayer feedforward neural network; a C/H estimation section 30 (i.e., C/H estimation unit); a compressibility estimation section 40 (i.e., compressibility estimation unit); an adhesion force estimation section 50 (i.e., adhesion force estimation unit); and a resistance estimation section 60 (i.e., resistance estimation unit). The adhesion force estimation section 50 and the resistance estimation section 60 may be arranged in this order or in reverse order with reference to the front and back direction. Alternatively, the design support system may be constituted of a single multilayer feedforward-type neural network.

As illustrated, the C/W estimation section 20 has learned in advance a relationship between known connection data and the crimp width C/W corresponding thereto (i.e., unknown connection data), wherein plate thickness data 10a showing a plate thickness "t" of the connector terminal 12, barrel length data 10b showing the length "L1" of a barrel, and computed cross-sectional area data 10c showing a computed cross-sectional area of the conductor 11A are taken as known connection data.

On the basis of the result of learning, the C/W estimation section 20 estimates a crimp width C/W for the plate thickness data 10a, the barrel length data 10b, and the computed cross-sectional area data 10c in accordance with inputs of these data sets, to thereby produce crimp width data 206a. The thus-produced crimp width data are output to a C/W setting section 21. The C/W setting section 21 outputs the thus-input crimp width data 206a in an unmodified form to the C/H estimation section 30.

The C/W setting section 21 acts as an input unit. When the designer has entered the crimp width data 206a, the thus-input crimp width data 206a can be output to the C/H estimation section 30. The C/W setting section 21 can output the crimp width data 206a entered by the designer as well as the crimp width data 206a estimated by the C/W estimation section 20 to the C/H estimation section 30. The C/W estimation section 20 outputs the thus-input plate thickness data 10a, the barrel length data 10b, and the computed cross-sectional area data 10c in an unmodified form to the C/H estimation section 30. Here, the scale of crimp width is in millimeters.

The C/H estimation section 30 takes, as known connection data, the plate thickness data 10a, the barrel length data 10b, the computed cross-sectional area data 10c, the crimp width data 206a, and anvil radius data 10d representing the radius R of the anvil 13. A relationship existing between the known connection data and the crimp height C/H for the known connection data (i.e., unknown connection data) has been learned beforehand.

The C/H estimation section 30 estimates a crimp height C/H for the plate thickness data 10a, the barrel length data 10b, the computed cross-sectional data 10c, the crimp width data 206a, and the anvil radius data 10d in accordance with inputs of these data sets, thereby producing crimp height data 306a. The thus-produced crimp height data 306a are output to a compressibility estimation section 40 by way of a sequential output section 70 (sequential output unit).

The sequential output section 70 sequentially outputs, as the crimp height data 306a, the input crimp height data 306a and a predetermined number of discrete values falling within a predetermined range, including the crimp height data 306a. Specifically, as shown in FIG. 3, the sequential output section 70 sequentially outputs the thus-input crimp height data 306a and nine discrete values; that is, a total of ten discrete values including the input crimp height data 306a.

Figure 3:
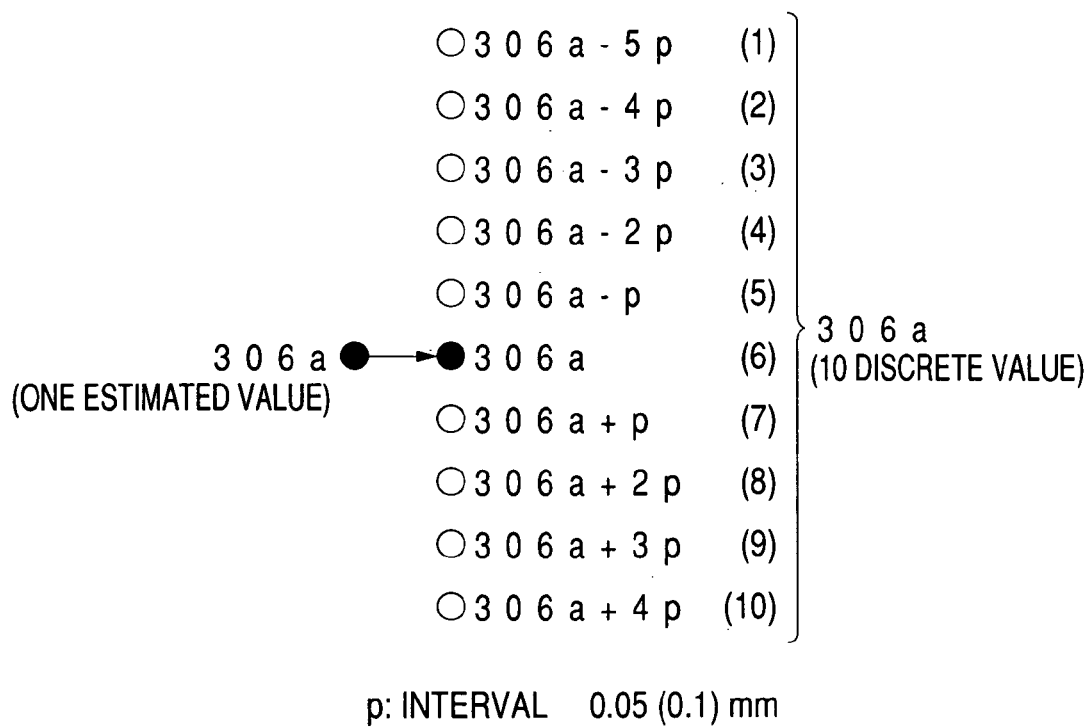
FIG. 3 is a view for describing an output from a sequential output section 70.

As is evident from FIG. 3, in this case, the predetermined range corresponds to −5p to +4p, and the predetermined number corresponds to nine. In the embodiment, the sequential output section 70 outputs discrete values, which remain discrete at uniform intervals "p," for the input crimp height data 306a However, the discrete values are not necessarily arranged at uniform intervals.

The C/H estimation section 30 outputs the thus-input plate thickness data 10a, barrel length data 10b, computed cross-sectional area data 10c, crimp width data 206a, and anvil radius data 10d, in an unmodified form, to the compressibility estimation section 40.

The compressibility estimation section 40 takes, as known connection data, the plate thickness data 10a, the barrel length data 10b, the computed cross-sectional data 10c, the crimp width data 206a, the anvil radius data 10d, the crimp height data 306a, constituent wire count data 10e representing the number of constituent wires 11A, and crimp length data 10f representing a crimp length of the connector terminal 12. A relationship between the known connection data and the compressibility of the conductor 11A in the crimping direction with reference to the known connection data (i.e., the unknown connection data) has already been learned.

On the basis of the result of learning, the compressibility estimation section 40 estimates compressibility for the plate thickness data 10a, the barrel length data 10b, the computed cross-sectional data 10c, the crimp width data 206a, the anvil radius data 10d, the crimp height data 306a, the constituent wire count data 10e, and the crimp length data 10f, in accordance with inputs of these data sets, to thereby produce compressibility data 406a. The thus-produced compressibility data 406a are output to the adhesion force estimation section 50.

The compressibility estimation section 40 outputs the input plate thickness data 10a, the barrel length data 10b, the computed cross-sectional area data 10c, the crimp width data 206a, the anvil radius data 10d, the crimp height data 306a, the constituent wire count data 10e, and the crimp length data 10f, in an unmodified form, to the adhesion force estimation section 50.

The adhesion force estimation section 50 takes, as known connection data, the plate thickness data 10a, the barrel length data 10b, the computed cross-sectional area data 10c, the crimp width data 206a, the anvil radius data 10d, the crimp height data 306a, the constituent wire count data 10e, the crimp length data 10f, and the compressibility data 406a. The relationship between the known connection data and the adhesion force that exists between the conductor 11A and the connector terminal 12 and corresponds to the known connection data (i.e., the unknown connection data) has been learned beforehand.

On the basis of the result of learning, the adhesion force estimation section 50 estimates adhesion force for the plate thickness data 10a, the barrel length data 10b, the computed cross-sectional area data 10c, the crimp width data 206a, the anvil radius data 10d, the crimp height data 306a, the constituent wire count data 10e, the crimp length data 10f, and the compressibility data 406a in accordance with inputs of these data sets. The adhesion force estimation section 50 estimates adhesion force corresponding to the data sets, thereby producing adhesion force data 506a, 506b—specifically, 506a denotes mean adhesion force, and 506b denotes a value of mean adhesion force—$3\sigma$ (a standard deviation)—.

The adhesion force estimation section 50 outputs the input plate thickness data 10a, the barrel length data 10b, the computed cross-sectional area data 10c, the crimp width data 206a, the anvil radius data 10d, the crimp height data 306a, the constituent wire count data 10e, the crimp length data 10f, and the compressibility data 406a, in an unmodified form, to the resistance estimation section 60.

The resistance estimation section 60 takes, as known connection data, the plate thickness data 10a, the barrel length data 10b, the computed cross-sectional area data 10c, the crimp width data 206a, the anvil radius data 10d, the crimp height data 306a, the constituent wire count data 10e, the crimp length data 10f, and the compressibility data 406a. The relationship between the known connection data and the contact resistance that exists between the conductor 11A and the connector terminal 12 and corresponds to the known connection data (i.e., the unknown connection data) has been learned beforehand.

On the basis of the result of learning, the resistance estimation section 60 estimates contact resistance for the plate thickness data 10a, the barrel length data 10b, the computed cross-sectional data 10c, the crimp width data 206a, the anvil radius data 10d, the crimp height data 306a, the constituent wire count data 10e, the crimp length data 10f, and the compressibility data 406a in accordance with inputs of these data sets, to thereby produce contact resistance data 606a, 606b (specifically, 606a denotes the maximum contact resistance, and 606b denotes mean contact resistance). The resistance estimation section 60 outputs the input crimp height data 306a in an unmodified form.

Figure 4:
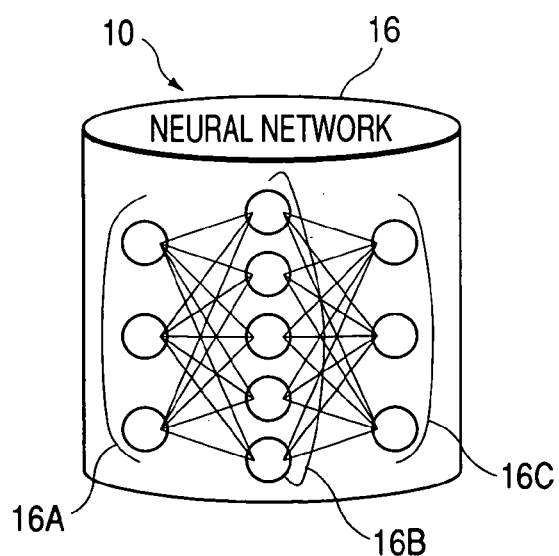
FIG. 4 is a view for describing a neural network 16 constituting respective estimation sections.

As shown in FIG. 4, the respective estimation sections are constituted of a multilayer feedforward neural network in which layers formed from a plurality of neurons are connected together in a direction running from an input layer 16A to an output layer 16C by way of an intermediate layer 16B.

The respective neurons constituting the input layer 16A of the multilayer feedforward neural network 16 are provided in a one-to-one correspondence in accordance with the number of input known connection data sets. The respective neurons constituting the input layer 16A are connected to respective neurons constituting the intermediate layer 16B. All the neurons constituting the intermediate layer 16B are connected to the respective neurons constituting the output layer 16C.

All the neurons constituting the input layer 16A, the intermediate layer 16B, and the output layer 16C perform the previously-described estimation operations by assigning the weights determined through learning to the data input to the respective neurons and outputting the thus-weighted data. A transfer function existing between the input layer 16A and the intermediate layer 16B of the multilayer feed-forward neural network 16 and a transfer function existing between the intermediate layer 16B and the output layer 16C are tangent sigmoid functions. As a result, there is constructed the design support system 10 which involves consumption of a shorter learning period and has a learning function with a high learning accuracy, and a neuro-computation function becomes easy.

Operation of the design support system 10 having the foregoing configuration will now be described. First, through use of an unillustrated input device, the designer inputs, to the design support system 10, the plate thickness data 10a, the barrel length data 10b, the computed cross-sectional area data 10c, the constituent wire count data 10e, and the crimp length data 10f.

In accordance with an input of the plate thickness data 10a, that of the barrel length data 10b, and that of the computed cross-sectional area data 10c, the C/W estimation section 20 estimates a crimp width C/W, to thereby produce the crimp width data 206a. The thus-produced crimp width data 206a are output to the C/H estimation section 30 by way of the C/W setting section 21. The C/W estimation section 20 outputs the input plate thickness data 10a, the barrel length data 10b, and the computed cross-sectional data 10c, in an unmodified form, to the C/H estimation section 30.

The C/H estimation section 30 estimates a crimp height C/H in accordance with the anvil radius data 10d input by the designer through use of the input device in consideration of the plate thickness data 10a output from the C/W estimation section 20, an input of the barrel length data 10b and the computed cross-sectional data 10c, an input of the crimp width data 206a output from the C/W setting section 21, and the crimp width estimated by the C/H estimation section 30, thereby producing the crimp height data 306a. The thus-produced crimp height data are output to the sequential output section 70.

As shown in FIG. 3, the sequential output section 70 takes, as the crimp height data 306a, a total of ten discrete values, including the input crimp height data 306a, in accordance with an input of the crimp height data 306a. The crimp height data 306a are sequentially output to the compressibility estimation section 40. The C/H estimation section 30 outputs the input plate thickness data 10a, the barrel length data 10b, the computed cross-sectional data 10c, the crimp width data 206a, and the anvil radius data 10d, in an unmodified form, to the compressibility estimation section 40.

The compressibility estimation section 40 estimates compressibility in accordance with an input consisting of the thickness plate data 10a output from the C/H estimation section 30, the barrel length data 10b, the computed cross-sectional area data 10c, the crimp width data 206a, and the anvil radius data 10d; an input consisting of a total of ten crimp height data sets 306a output from the sequential output section 70; and an input consisting of the constituent wire count data 10e and the crimp length data 10f entered through use of the input device, thereby producing the compressibility data 406a. The thus-produced compressibility data 406a are output to the adhesion force estimation section 50.

As mentioned above, the sequential output section 70 inputs ten discrete values, such as those shown in FIG. 3, to the compressibility estimation section 40 as the crimp height data 306a. Hence, the compressibility estimation section 40 produces ten compressibility data sets 406a for the respective crimp height data sets 306a and outputs the thus-produced compressibility data sets 406a to the adhesion force estimation section 50.

The compressibility estimation section 40 outputs the input plate thickness data 10a, the barrel length data 10b, the computed cross-sectional data 10c, the crimp width data 206a, the anvil radius data 10d, the crimp height data 306a, the constituent wire count data 10e, and the crimp length data 10f, in an unmodified form, to the adhesion force estimation section 50.

The adhesion force estimation section 50 estimates adhesion force in accordance with the plate thickness data 10a, the barrel length data 10b, the computed cross-sectional area data 10c, the crimp width data 206a, the anvil radius data 10d, the crimp height data 306a, the constituent wire count data 10e, the crimp length data 10f, and the compressibility data 406a, all being inputs delivered from the compressibility estimation section 40, thereby producing adhesion force data 506a, 506b.

As mentioned previously, the sequential output section 70 outputs the ten crimp height data sets 306a to the adhesion force estimation section 50 by way of the compressibility estimation section 40. The compressibility estimation section 40 outputs the ten compressibility data sets 406a to the adhesion force estimation section 50. Hence, the adhesion force estimation section 50 outputs ten adhesion force data sets 506a, 506b for the ten crimp height data sets 306a and the compressibility data 406a.

The adhesion force estimation section 50 outputs the input plate thickness data 10a, the input barrel length data 10b, the input computed cross-sectional area data 10c, the input crimp width data 206a, the input anvil radius data 10d, the input crimp height data 306a, the input constituent wire count data 10e, the input crimp length data 10f, and the input compressibility data 406a, in an unmodified form, to the resistance estimation section 60.

The resistance estimation section 60 estimates contact resistance in accordance with the plate thickness data 10a, the barrel length data 10b, the computed cross-sectional data 10c, the crimp width data 206a, the anvil radius data 10d, the crimp height data 306a, the constituent wire count data 10e, the crimp length data 10f, and the compressibility data 406a, all being inputs delivered from the adhesion force estimation section 50, thereby producing and outputting contact resistance data sets 606a, 6060b.

As mentioned above, the sequential output section 70 outputs the ten crimp height data sets 306a to the resistance estimation section 60 by way of the compressibility estimation section 40 and the adhesion force estimation section 50. The compressibility estimation section 40 outputs the ten compressibility data sets 406a to the resistance estimation section 60 by way of the adhesion force estimation section 50. The resistance estimation section 60 outputs the ten contact resistance data sets 606a, 606b for the ten crimp height data sets and the compressibility data.

When the connection data such as those shown in FIG. 5A are input through use of the design support system 10, estimation data such as those shown in FIG. 5B are obtained.

Figure 5C:
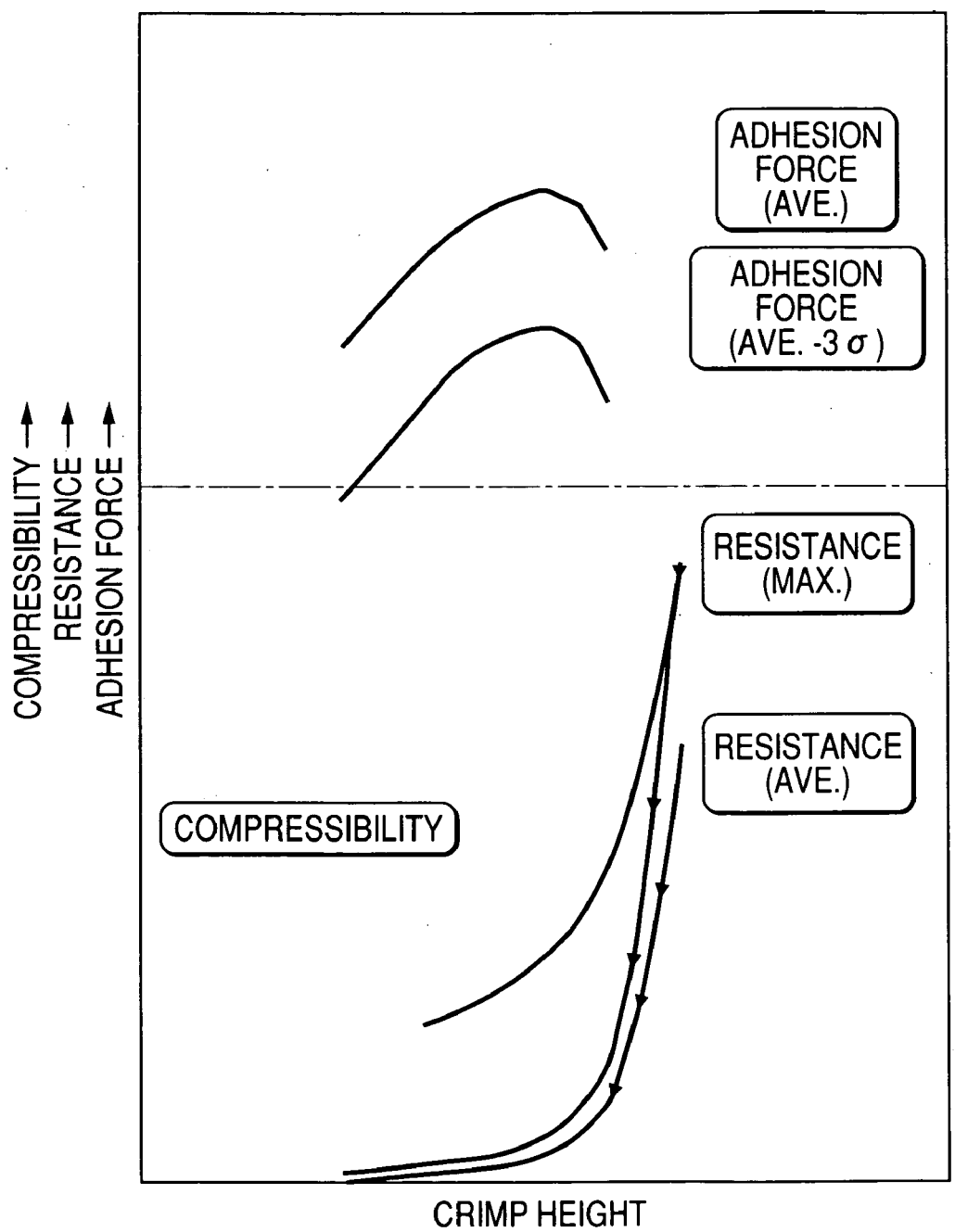
FIG. 5C is a graph showing the relationships of crimp height versus adhesion force, resistance, and compressibility estimated through use of the design support system shown in FIG. 1.

A graph is plotted while the crimp height data 206a estimated by the design support system 10 is taken as a horizontal axis and the compressibility data 406a, the contact resistance data 606a, 606b, and the adhesion force data 506a, 506b, all being estimated in correspondence to the crimp height data 206a, are taken as the vertical axis. For instance, a crimp characteristic such as that shown in FIG. 5C is obtained.

At the time of design of a new connection, the computed cross-sectional area of the conductor 11A, the plate thickness "t" of the connector terminal 12, the barrel length L1, the crimp length A1, and the radius R of the anvil 13 are designed. Before actual crimp connection is effected through use of the thus-designed conductor 11A, the connector terminal 12, and the anvil 13, the design support system 10 estimates a crimp height C/H, an adhesion force, and a contact resistance. A rough crimp height C/H, a rough adhesion force, and a rough contact resistance, which would be possibly obtained, can be ascertained by the designer without actual crimp connection being carried out.

Therefore, support can be provided so that the designer can readily design a connection between the conductor 11A and the connector terminal 12 within a short period of time without depending on the designer's experience.

According to the foregoing design support system 10, the crimp width data 206a produced by the C/W estimation section 20 is input to a C/H estimation section 30 as at least a portion of known connection data required for estimating the crimp height C/H. Therefore, the designer does not need to estimate the crimp width C/W and input the thus-estimated crimp width C/W to the C/H estimation section 30 through use of the input device. Support can be provided so that any designer can more easily design a connection between a conductor and a connector terminal without depending on the designer's experience and within a short period of time.

According to the foregoing design support system 10, the crimp width data 206a produced by the C/W estimation section 20 and the crimp height data 306a produced by the C/H estimation section 30 are input to the compressibility estimation section 40 as at least a portion of the known connection data required for estimating compressibility. Therefore, there is obviated a necessity for the designer to estimate the crimp width C/W and the crimp height C/H and input the thus-estimated crimp width and the crimp height to the compressibility estimation section 40 through use of the input device. Support can be provided so that any designer can more easily design a connection between a conductor and a connector terminal without depending on the designer's experience and within a short period of time.

According to the foregoing design support system 10, the crimp width data 206a produced by the C/W estimation section 20, the crimp height data 306a produced by the C/H estimation section 30, and the compressibility data 406a produced by the compressibility estimation section 40 are input to the adhesion force estimation section 50 as at least a portion of the known connection data required for estimating adhesion force. Therefore, there is obviated a necessity for the designer to estimate the crimp width C/W, the crimp height C/H, and the compressibility and input the thus-estimated crimp width, the crimp height, and the compressibility to the adhesion force estimation section 50 through use of the input device. Support can be provided so that any designer can more easily design a connection between a conductor and a connector terminal without depending on the designer's experience and within a short period of time.

According to the foregoing design support system 10, the crimp width data 206a produced by the C/W estimation section 20, the crimp height data 306a produced by the C/H estimation section 30, and the compressibility data 406a produced by the compressibility estimation section 40 are input to the resistance estimation section 60 as at least a portion of the known connection data required for estimating contact resistance. Therefore, there is obviated a necessity for the designer to estimate the crimp width C/W, the crimp height C/H, and the compressibility and input the thus-estimated crimp width, the crimp height, and the compressibility to the resistance estimation section 60 through use of the input device. Support can be provided so that any designer can more easily design a connection between a conductor and a connector terminal without depending on the designer's experience and within a short period of time.

According to the design support system 10, the sequential output section 70 automatically outputs ten discrete values as the crimp height data 306a in accordance with an input of the crimp height data 306a. Therefore, the sequential output section 70 automatically inputs the discrete values centered on the crimp height data 306a produced by the C/H estimation section 30 to the compressibility estimation section 40 without a necessity of the designer to enter the discrete values. Hence, more detailed connection characteristics can be obtained readily.

Figure 6:
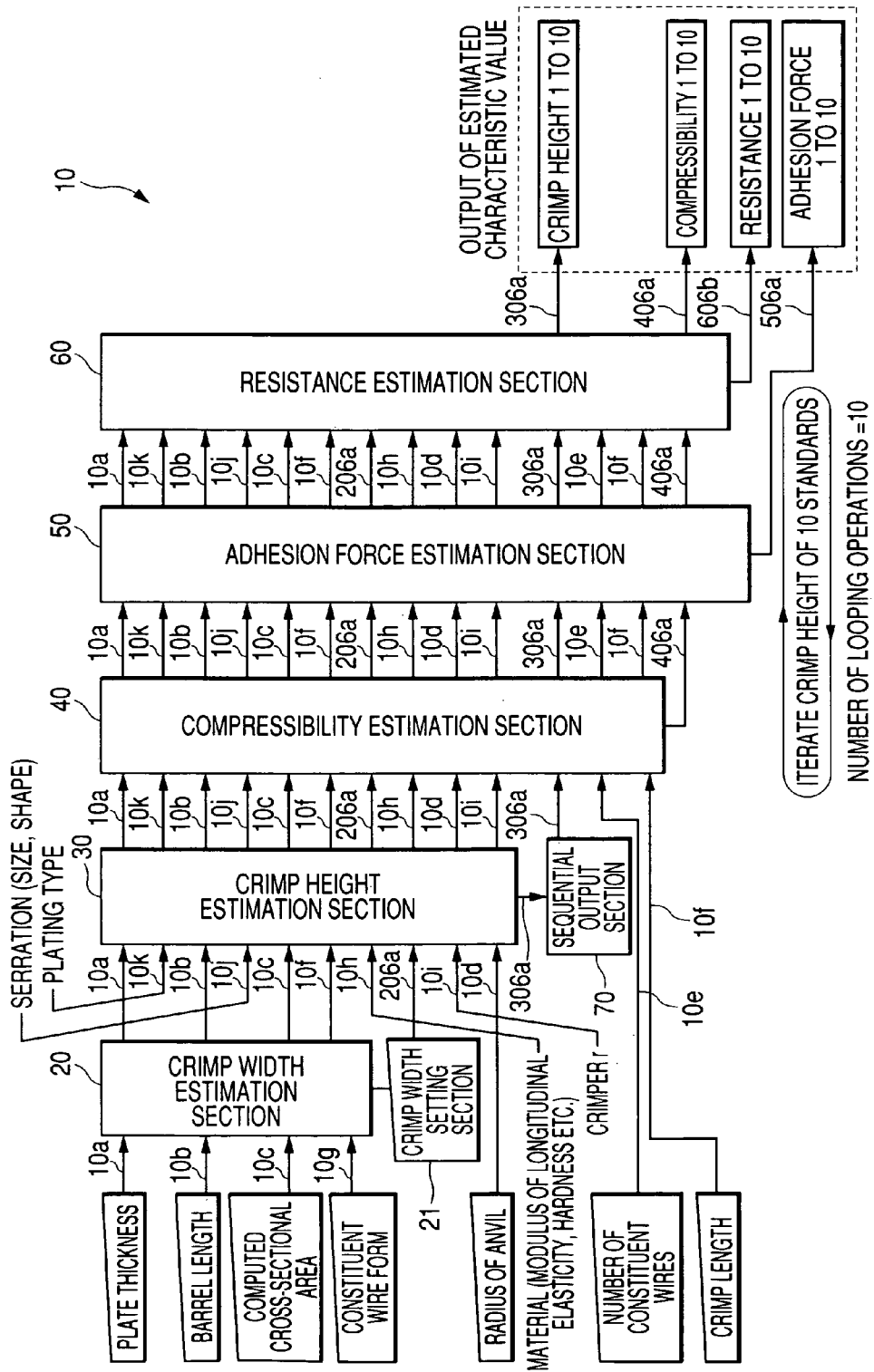
FIG. 6 is a view showing an applied example of the design support system shown in FIG. 1.

In the first embodiment, the plate thickness data 10a, the barrel length data 10b, and the computed cross-sectional data 10c are input to the C/W estimation section 20 as the known connection data. However, as shown in FIG. 6, in order to estimate the crimp height C/H more accurately, constituent wire form data 10g indicating the form of a constituent wire of the conductor 11A (e.g., a standard, compressibility, and concentricity) are also input to the C/W estimation section 20 as known connection data, whereby learning and estimation may be performed.

In addition to the known connection data shown in FIG. 1, plating type data 10k indicating the type of plating of the connector terminal 12, serration data 10j indicating the dimension and shape of a serration 12E (see FIGS. 2A to 2F), material data 10h indicating material properties such as a modulus of longitudinal elasticity and hardness of the connector terminal 12, and crimper data 10i indicating the radius "r" of the crimper 14A may be input to the C/H estimation section 30, the compressibility estimation section 40, the adhesion force estimation section 50, and the resistance estimation section 60, to thereby effect learning and estimation.

In the first embodiment, the sequential output section 70 is arranged so as to sequentially output the crimp height data 306a. However, if necessary, the sequential output section 70 can be arranged so as to sequentially output the crimp width data 206a and the compressibility data 406a.

Second Embodiment

Figure 8A:
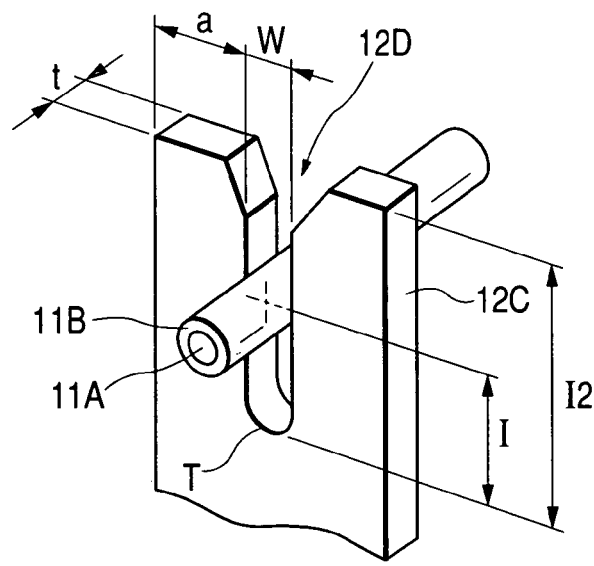
FIGS. 8A and 8B are perspective views showing the geometry of a connector terminal 12 used for press-fitting (crimping connection)
Figure 8B:
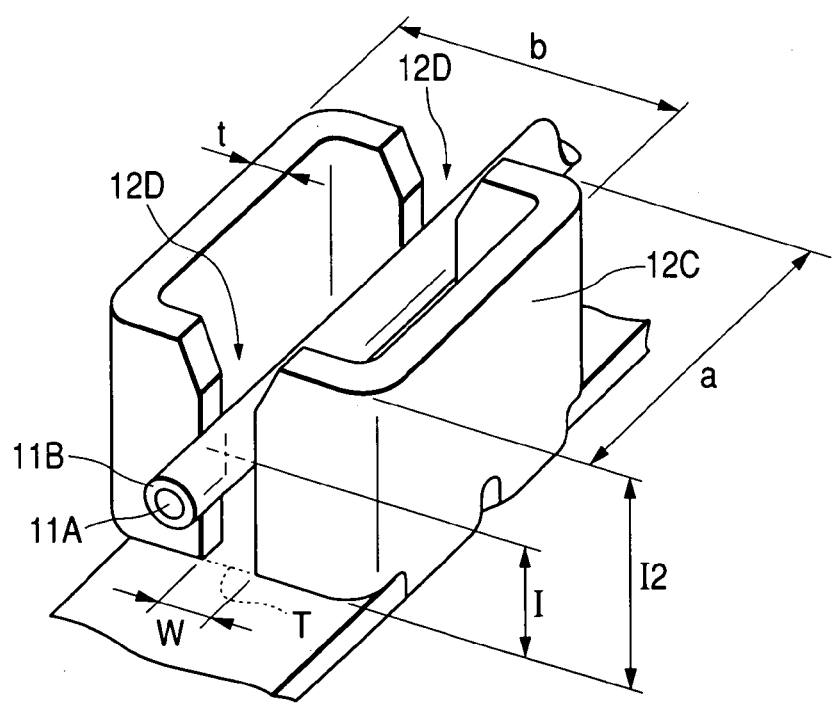

Next, a second embodiment of the invention will be described. FIG. 7 is a view showing the second embodiment of the design support system 10. As shown in FIGS. 8A and 8B, the design support system 10 is a system which, at the time of connection of the conductor 11A sheathed with the insulation cladding 11B into the slot 12D formed in the connector terminal 12 by means of press-fitting, supports the design of a connection by previously estimating connection data pertaining to unknown connection design, such as a slot width W, a crimp height "l" which is a height from a base T of a slot 12D to the center of the conductor 11A, crimp load exerted on the conductor 11A in the direction of press-fitting, and withdrawal force and contact resistance exerted between the conductor 11A and the connector terminal 12 prior to actual press-fitting connection.

As illustrated, the design support system 10 has a slot width estimation section 80 (i.e., slot width estimation unit) formed from a multilayer feedforward neural network; a crimp height estimation section 90 (i.e., crimp height estimation unit); a load estimation section 100 (i.e., load estimation unit); a withdrawal force estimation section 110 (i.e., withdrawal force estimation unit); and a resistance estimation section 120(i.e., resistance estimation unit). The withdrawal force estimation section 110 and the resistance estimation section 120 may be arranged in this order or in the reverse order with reference to the front and back direction. Alternatively, the design support system may be constituted of a single multilayer feedforward-type neural network.

As illustrated, the slot width estimation section 80 takes, as known connection data, plate thickness data 10*l* representing the thickness of a plate of the connector terminal 12; beam width data 10*m* showing a beam width "a" of the slot 12D; slot depth data 10*n* showing the depth of the slot 12D; Young's modulus data 10*o* showing the Young's modulus of the slot 12D; and conductor cross-sectional area data 10*p* showing the cross-sectional area of the conductor 11A. A relationship between the known connection data and the slot width (corresponding to the unknown connection data) for the known connection data has been studied beforehand.

On the basis of the result of learning, the slot width estimation section 80 estimates a slot width W for the plate thickness data 10*l*, the beam width data 10*m*, the slot depth data 10*n*, the Young's modulus data 10*o* and the conductor cross-sectional area 10*p* in accordance with inputs of the data sets, to thereby produce slot width data 706*a*. The thus-produced slot width data are output to a slot width setting section 81. The slot width setting section 81 outputs the thus-input slot width data 706*a* in an unmodified form to the crimp height estimation section 90.

The slot width setting section 81 acts as an input unit. When the designer has entered the slot width data 706*a*, the thus-input slot width data 706*a* can be output to the crimp height estimation section 90. The slot width estimation section 81 can output to the crimp height estimation section 90 the slot width data 706*a* estimated by the slot width estimation section 80 as well as the slot width data 709*a* entered by the designer. The slot width estimation section 80 outputs to the crimp height estimation section 90, in an unmodified form, the thus-input plate thickness data 10*l*, the beam width data 10*m*, the slot depth data 10*n*, the Young's modulus data 10*o*, and the conductor cross-sectional area data 10*p*.

The crimp height estimation section 90 takes, as known connection data, the plate thickness data 10*l*, the beam width data 10*m*, the slot depth data ion, the Young's modulus data 10*o*, the conductor cross-sectional area data 10*p*, the slot width data 706*a*, constituent wire diameter data 10*q* representing the diameter of a constituent diameter of the conductor 11A, constituent wire count data 10*r* representing the number of constituent wires, and cladding hardness data 10*s* showing the hardness of the insulation cladding 11B. A relationship between the known connection data and the crimp height "l" for the known connection data (i e., the unknown connection data) has already been learned.

On the basis of the result of learning, the crimp height estimation section 90 estimates the crimp height "l" for the plate thickness data 10*l*, the beam width data 10*m*, the slot depth data 10*n*, the Young's modulus data 10*o*, the conductor cross-sectional area data 10*p*, the slot width data 706*a*, the constituent wire diameter data 10*q*, the constituent wire count data 10*r*, and the cladding hardness data 10*s* in accordance with inputs of these data sets, thereby producing crimp height data 806*a*. The thus-produced crimp height data 806*a* are output to the load estimation section 100 by way of a sequential output section 130 (sequential output unit).

The sequential output section 130 takes, as crimp height data 806*a*, the input crimp height data 806*a* and a predetermined number of discrete values falling within a predetermined range including the input crimp height data 806*a*. Specifically, as shown in FIG. 9, the sequential output section 130 sequentially outputs the thus-input crimp height data 806*a* and nine discrete values; that is, a total of ten discrete values including the thus-input crimp height data 806*a*.

As is evident from FIG. 9, in this case, the predetermined range corresponds to −5p to +4p, and the predetermined number corresponds to nine. In the embodiment, the sequential output section 130 outputs discrete values, which remain discrete at uniform intervals "p," from the input crimp height data 806*a*. However, the discrete values are not necessarily arranged at uniform intervals.

The crimp height estimation section 90 outputs to the load estimation section 100, in an unmodified form, the thus-input plate thickness data 10*l*, the beam width data 10*m*, the slot depth data 10*n*, the Young's modulus data 10*o*, the conductor cross-sectional area data 10*p*, the slot width data 706*a*, the constituent wire diameter data 10*q*, the constituent wire count data 10*r*, and the cladding hardness data 10*s*.

The load estimation section 100 takes, as known connection data, the plate thickness data 10*l*, the beam width data 10*m*, the slot depth data 10*n*, the Young's modulus data 10*o*, the conductor cross-sectional area data 10*p*, the slot width data 706*a*, the constituent wire diameter data 10*q*, the constituent wire count data 10*r*, the cladding hardness data 10*s*, and the crimp height data 806*a*. A relationship between the known connection data and the load for the known connection data (i.e., the unknown connection data) has already been learned.

On the basis of the result of learning, the load estimation section 100 estimates the load for the plate thickness data 10*l*, the beam width data 10*m*, the slot depth data 10*n*, the Young's modulus data 10*o*, the conductor cross-sectional area data 10*p*, the slot width data 706*a*, the constituent wire diameter data 10*g*, the constituent wire count data 10*r*, the cladding hardness data 10*s*, and the crimp height data 806*a*, in accordance with inputs of these data sets, to thereby produce load data 906*a*. The thus-produced load data 906*a* are output to the withdrawal force estimation section 110.

The load estimation section 100 outputs to the withdrawal force estimation section 110, in an unmodified form, the plate thickness data 10*l*, the beam width data 10*m*, the slot depth data 10*n*, the Young's modulus data 10*o*, the conductor cross-sectional area data 10*p*, the slot width data 706*a*, the constituent wire diameter data 10*q*, the constituent wire count data 10*r*, the cladding hardness data 10*s*, and the crimp height data 806*a*, all being input in the manner set forth.

The withdrawal force estimation section 110 takes, as known connection data, the plate thickness data 10*l*, the beam width data 10*m*, the slot depth data 10*n*, the Young's modulus data 10*o*, the conductor cross-sectional area data 10*p*, the slot width data 706*a*, the constituent wire diameter data 10*q*, the constituent wire count data 10*r*, the cladding hardness data 10*s*, the crimp height data 806*a*, and the load data 906*a*. A relationship between the known connection data and the withdrawal force for the known connection data (i.e., the unknown connection data) has already been learned.

On the basis of the result of learning, the withdrawal force estimation section 110 estimates withdrawal force for the thus-input plate thickness data 10*l*, the beam width data 10*m*, the slot depth data 10*n*, the Young's modulus data 10*o*, the conductor cross-sectional area data 10*p*, the slot width data 706*a*, the constituent wire diameter data 10*q*, the constituent wire count data 10*r*, the cladding hardness data 10*s*, the crimp height data 806*a*, and the load data 906*a* in accordance with inputs of these data sets, thereby producing withdrawal data 1006*a*, 1006*b*—specifically, 1006*a* denotes mean withdrawal force, and 1006*b* denotes a value determined by subtracting the mean withdrawal force [3σ (a standard deviation)].

The withdrawal force estimation section 110 outputs to the resistance estimation section 120, in an unmodified form, the thus-input plate thickness data 10*l*, the beam width data 10*m*, the slot depth data 10*n*, the Young's modulus data 10*o*, the conductor cross-sectional area data 10*p*, the slot width data 706*a*, the constituent wire diameter data 10*q*, the constituent wire count data 10*r*, the cladding hardness data 10*s*, the crimp height data 806*a*, and the load data 906*a*.

The resistance estimation section 120 takes, as known connection data, the plate thickness data 10*l*, the beam width data 10*m*, the slot depth data 10*n*, the Young's modulus data 10*o*, the conductor cross-sectional area data 10*p*, the slot width data 706*a*, the constituent wire diameter data 10*q*, the constituent wire count data 10*r*, the cladding hardness data 10*s*, the crimp height data 806*a*, and the load data 906*a*. The relationship between the known connection data and the contact resistance that exists between the conductor 11A and the connector terminal 12 and corresponds to the known connection data (i.e., unknown connection data) has been learned beforehand.

On the basis of the result of learning, the resistance estimation section 120 estimates contact resistance for the plate thickness data 10*l*, the beam width data 10*m*, the slot depth data 10*n*, the Young's modulus data 10*o*, the conductor cross-sectional area data 10*p*, the slot width data 706*a*, the constituent wire diameter data 10*q*, the constituent wire count data 10*r*, the cladding hardness data 10*s*, the crimp height data 806*a*, and the load data 906*a* in accordance with inputs of these data sets, thereby producing contact resistance data 1106*a*, 1106*b* (specifically, 1106*a* denotes the maximum contact resistance, and 1106*b* denotes mean contact resistance). The resistance estimation section 120 outputs the input load data 906*a* in an unmodified form.

As described in connection with the first embodiment by reference to FIG. 4, the respective estimation sections are constituted of a multilayer feedforward neural network in which layers formed from a plurality of neurons are connected together in a direction running from the input layer 16A to the output layer 16C by way of the intermediate layer 16B.

Operation of the design support system 10 having the foregoing configuration will now be described. First, the designer inputs the plate thickness data 10*l*, the beam width data 10*m*, the slot depth data 10*n*, the Young's modulus data 10*o*, the conductor cross-sectional area data 10*p*, the constituent wire diameter data 10*q*, the constituent wire count data 10*r*, and the cladding hardness data 10*s* to the design support system 10 through use of an unillustrated input device.

The slot width estimation section 80 estimates a slot width W for the plate thickness data 10*l*, the beam width data 10*m*, the slot depth data 10*n*, the Young's modulus data 10*o*, and the conductor cross-sectional area data 10*p* in accordance with inputs of these data sets, to thereby produce the slot width data 706*a*. The thus-produced slot width data are output to the crimp height estimation section 90 by way of the slot width setting section 81. The slot width estimation section 80 also outputs to the crimp height estimation section 90, in an unmodified form, the thus-input beam width data 10*m*, the slot depth data 10*n*, the Young's modulus data 10*o*, and the conductor cross-sectional area data 10*p*.

The crimp height estimation section 90 estimates the crimp height "l" and produces the crimp height data 806*a* in accordance with the plate thickness data 10*l*, the beam width data 10*m*, the slot depth data 10*n*, the Young's modulus data 10*o*, and the conductor cross-sectional area data 10*p*, all being output from the slot width estimation section 80; the slot width data 706*a* output from the slot width setting section 81; and the constituent wire diameter data 10*q*, the constituent wire count data 10*r*, and the cladding hardness data 10*s*, all being entered through use of the input device. The thus-produced crimp height data 806*a* are output to the sequential output section 130.

As shown in FIG. 9, in accordance with an input of the crimp height data 806*a*, the sequential output section 130 sequentially outputs a total of ten discrete values including the thus-input crimp height data 806*a* to the load estimation section 100 as the crimp height data 806*a*. In contrast, the crimp height estimation section 90 outputs to the load estimation section 100, in an unmodified form, the thus-input plate thickness data 10*l*, the beam width data 10*m*, the slot depth data 10*n*, the Young's modulus data 10*o*, the conductor cross-sectional area data 10*p*, the slot width data 706*a*, the constituent wire diameter data 10*q*, the constituent wire count data 10*r*, and the cladding hardness data 10*s*.

The load estimation section 100 estimates load in accordance with the plate thickness data 10*l*, the beam width data 10*m*, the slot depth data 10*n*, the Young's modulus data 10*o*, the conductor cross-sectional area data 10*p*, the slot width data 706*a*, the constituent wire diameter data 10*q*, the constituent wire count data 10*r*, and the cladding hardness data 10*s*, all being output from the crimp height estimation section 90; and a total of ten crimp height data sets 806*a* output from the sequential output section 130, to thereby produce the load data 906*a*. The thus-produced load data 906*a* are output to the withdrawal force estimation section 110.

As mentioned previously, the sequential output section 130 inputs the ten discrete values such as those shown in FIG. 9 to the load estimation section 100 as the crimp height data 806*a*. Hence, the load estimation section 100 produces the ten load data sets 906*a* for the respective crimp height data sets 806*a* and outputs the thus-produced load data to the withdrawal force estimation section 110.

The load estimation section 100 outputs to the withdrawal force estimation section 110, in an unmodified form, the thus-input plate thickness data 10*l*, the beam width data 10*m*, the slot depth data 10*n*, the Young's modulus data 10*o*, the conductor cross-sectional area data 10*p*, the slot width data 706*a*, the constituent wire diameter data 10*q*, the constituent wire count data 10*r*, the cladding hardness data 10*s*, and the crimp height data 806*a*.

The withdrawal force estimation section 110 estimates withdrawal force in accordance with the plate thickness data 10*l*, the beam width data 10*m*, the slot depth data 10*n*, the Young's modulus data 10*o*, the conductor cross-sectional area data 10*p*, the slot width data 706*a*, the constituent wire diameter data 10*q*, the constituent wire count data 10*r*, the cladding hardness data 10s, the crimp height data 806a, and the load data 906a, all being output from the load estimation section 100, thereby producing the withdrawal data 1006a, 1006b.

As mentioned previously, the sequential output section 130 outputs the ten crimp height data sets 806a to the withdrawal force estimation section 110 by way of the load estimation section 100. The load estimation section 100 outputs the ten load data sets 906a to the withdrawal force estimation section 110. Hence, the withdrawal force estimation section 110 outputs ten withdrawal force data sets 1006a, 1006b for the ten crimp height data sets 806a and the load data 906a.

The withdrawal force estimation section 110 outputs to the resistance estimation section 120, in an unmodified form, the plate thickness data 10l, the beam width data 10m, the slot depth data 10n, the Young's modulus data 10o, the conductor cross-sectional area data 10p, the slot width data 706a, the constituent wire diameter data 10q, the constituent wire count data 10r, the cladding hardness data 10s, the crimp height data 806a, and the load data 906a.

The resistance estimation section 120 estimates contact resistance in accordance with the thus-input plate thickness data 10l, the beam width data 10m, the slot depth data 10n, the Young's modulus data 10o, the conductor cross-sectional area data 10p, the slot width data 706a, the constituent wire diameter data 10q, the constituent wire count data 10r, the cladding hardness data 10s, the crimp height data 806a, and the load data 906a, all being output from the withdrawal force estimation section 110, thereby producing and outputting the contact resistance data 1106a, 1106b.

As mentioned previously, the sequential output section 130 outputs the ten crimp height data sets 806a to the resistance estimation section 120 by way of the load estimation section 100 and the withdrawal force estimation section 110. The load estimation section 100 outputs the ten load data sets 906a to the resistance estimation section 120 by way of the withdrawal force estimation section 110. Hence, the resistance estimation section 120 outputs ten contact resistance data sets 1106a, 1106b for the respective crimp height data sets 806a and load data 906a.

Figure 10A:
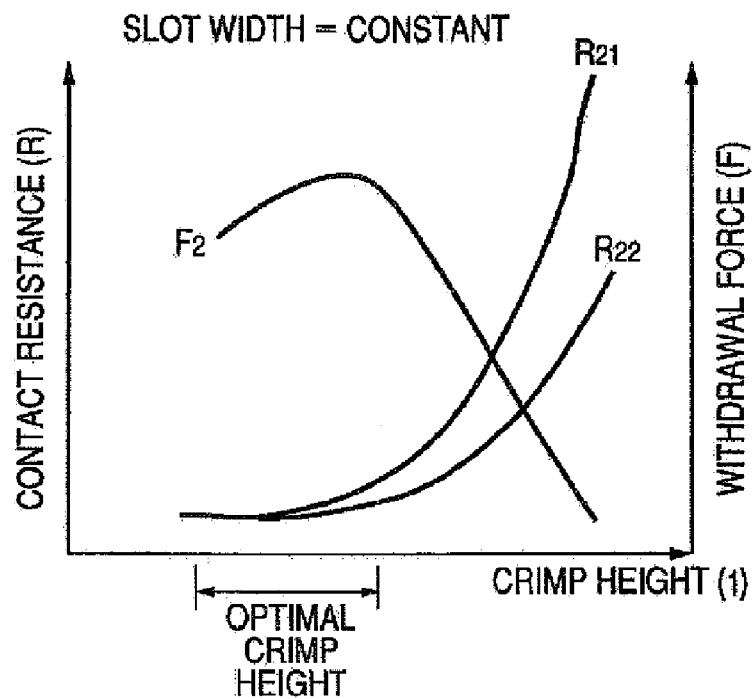
FIG. 10A is a graph showing the relationships of crimp height "l" versus withdrawal force and contact resistance achieved when press-fitting (crimping) connection has been performed.

A graph is plotted while the crimp height data 806a estimated by the design support system 10 is taken as a horizontal axis and the withdrawal force data 106a and the contact resistance data sets 606a, 606b are taken as the vertical axis. For instance, a press-fitting (or crimping) characteristic such as that shown in FIG. 10A is obtained.

When connection design complying with a new standard is reported, the conductor cross-sectional area of the conductor 11A, the diameter of the constituent wire, the number of constituent wires, the hardness of a cladding, the plate thickness "t" of the connector terminal 12, the beam width "a," the slot depth 12D, and the Young's modulus are designed, on the basis of the details of the report. Before actual press-fitting (crimping) connection is effected through use of the thus-designed conductor 11A and the connector terminal 12, the design support system 10 estimates the crimp height "l," load, withdrawal force, and contact resistance. A rough crimp height "l," the rough load, the rough withdrawal force, and the rough contact resistance, which would be possibly obtained, can be ascertained without carrying out actual crimp connection.

Therefore, support can be provided so that the designer can readily design a connection between the conductor 11A and the connector terminal 12 within a short period of time without depending on the designer's experience.

According to the foregoing design support system 10, the slot width data 706a produced by the slot width estimation section 80 are input to the crimp height estimation section 90 as at least a portion of known connection data required for estimating the crimp height "l." Therefore, the designer does not need to estimate the slot width W and input the thus-estimated slot width W to the crimp height estimation section 90 through use of the input device. Support can be provided so that any designer can more easily design a connection between a conductor and a connector terminal without depending on the designer's experience and within a short period of time.

According to the foregoing design support system 10, the slot width data 706a produced by the slot width estimation section 80 and the crimp height data 806a produced by the crimp height estimation section 90 are input to the load estimation section 100 as at least a portion of known connection data required for estimating load. Therefore, the designer does not need to estimate the slot width W and the crimp height "l" and input the thus-estimated slot width W and the crimp height "l" to the load estimation section 100 through use of the input device. Support can be provided so that any designer can more easily design a connection between a conductor and a connector terminal without depending on the designer's experience and within a short period of time.

According to the foregoing design support system 10, the slot width data 706a produced by the slot width estimation section 80, the crimp height data 806a produced by the crimp height estimation section 90, and the load data 906a produced by the load estimation section 100 are input to the withdrawal force estimation section 110 as at least a portion of known connection data required for estimating withdrawal force. Therefore, the designer does not need to estimate the slot width W, the crimp height "l," and the load and input the thus-estimated slot width W, crimp height "l," and load to the withdrawal force estimation section 110 through use of the input device. Support can be provided so that any designer can more easily design a connection between a conductor and a connector terminal without depending on the designer's experience and within a short period of time.

According to the foregoing design support system 10, the slot width data 706a produced by the slot width estimation section 80, the crimp height data 806a produced by the crimp height estimation section 90, and the load data 906a produced by the load estimation section 100 are input to the contact resistance estimation section 120 as at least aportion of known connection data required for estimating contact resistance. Therefore, the designer does not need to estimate the slot width W, the crimp height "l," and the load and input the thus-estimated slot width W, crimp height "l," and load to the resistance estimation section 120 through use of the input device. Support can be provided so that any designer can more easily design a connection between a conductor and a connector terminal without depending on the designer's experience and within a short period of time.

According to the previously-described design support system 10, the sequential output section 130 automatically outputs ten discrete values as the crimp height data 806a in accordance with an input of the crimp height data 806a. Therefore, the sequential output section 130 automatically inputs the discrete values centered on the crimp height data 806a produced by the crimp height estimation section 90 without a necessity of the designer to enter the discrete values. Hence, a more detailed connection characteristics can be readily obtained.

In the second embodiment, the sequential output section 130 is arranged so as to sequentially output the crimp height data 806a. However, the sequential output section 130 is also considered to be interposed between the slot width estimation section 80 and the crimp height estimation section 90. In accordance with an input of the slot width data 706a, the sequential output section 130 is also considered to output ten discrete values, including the automatically-entered slot width data 706a, as slot width data 706a.

Figure 10B:
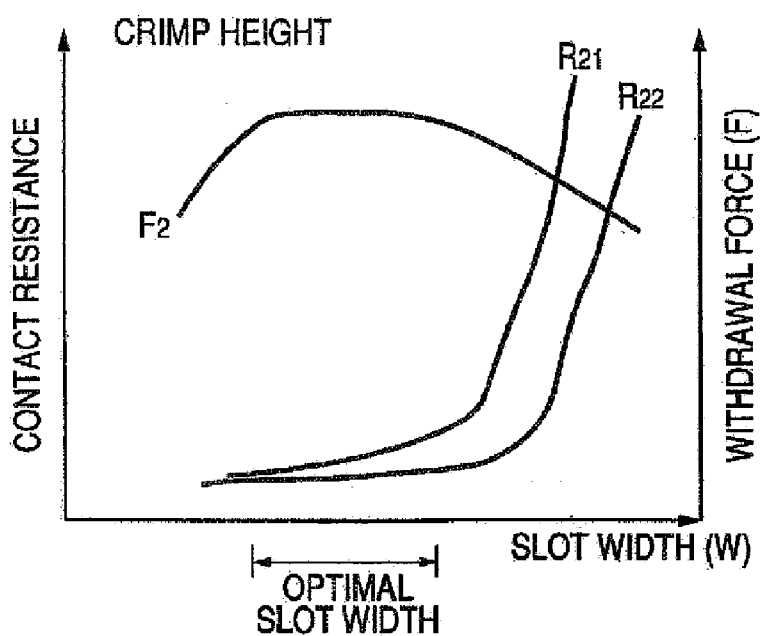
FIG. 10B is a graph showing the relationships of slot width "W" versus withdrawal force and contact resistance achieved when press-fitting (crimping) connection has been performed.
Figure 11:
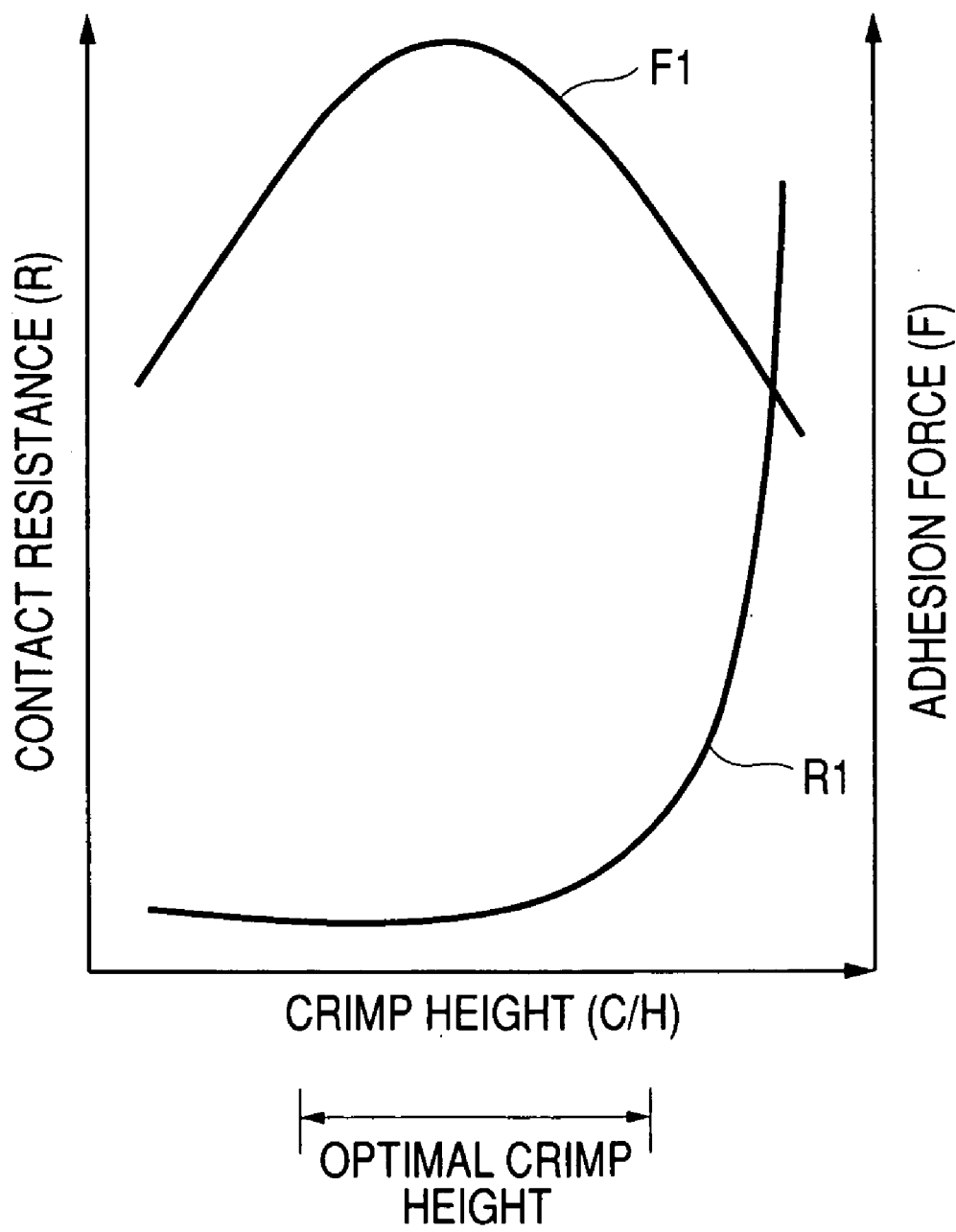
FIG. 11 is a graph showing the relationships of crimp height C/H versus adhesion force and contact resistance achieved when crimping connection has been performed.

A graph is plotted while the slot width data 706a estimated by the design support system 10 is taken as a horizontal axis and the withdrawal force data 1006a and the contact resistance data sets 606a, 606b are taken as the vertical axis. For instance, a press-fitting (or crimping) characteristic such as that shown in FIG. 10B is obtained.

The sequential output section 130 is not limited to a device which sequentially outputs the previously-described slot width data 706a and the crimp height data 806a. If necessary, the sequential output section 130 may sequentially output the load data 906a.

As has been described, according to the invention, the estimation unit estimates the unknown connection data in accordance with the input of known connection data, whereby a designer can ascertain rough values of the unknown connection data without actually connecting a conductor to a connector in accordance with the connection data. Consequently, there can be obtained a design support system capable of offering support so that any designer can more easily design a connection between a conductor and a connector terminal without depending on the designer's experience and within a short period of time.

According to the invention, use of a multilayer feedforward neural network having a superior learning feature enables accurate estimation of unknown connection data. Consequently, there can be obtained a design support system capable of offering support so that any designer can more easily design a connection between a conductor and a connector terminal without depending on the designer's experience and within a short period of time.

According to the invention, the designer can ascertain rough values of a crimp width, that of a crimp height, that of compressibility, that of adhesion force, and that of contact resistance without actually connecting a conductor to a connector in accordance with the connection data. Consequently, there can be obtained a design support system capable of offering support so that any designer can more easily design a connection between a conductor and a connector terminal without depending on the designer's experience and within a short period of time.

According to the invention, the C/W estimation unit estimates a crimp width obtained after crimping in accordance with an input of the known connection data. The C/H estimation unit estimates a crimp height obtained after crimping in accordance with an input of the known connection data. As a result, the designer can ascertain a rough value of a crimp width and that of a crimp height without actually connecting a conductor to a connector in accordance with the connection data. Further, the crimp width data produced by the C/W estimation unit are input to the C/H estimation unit as at least a portion of the known connection data required for estimating a crimp height. Since there is no necessity for the designer to estimate a crimp width and input the thus-estimated crimp width to the C/W estimation unit, there can be obtained a design support system capable of offering support so that any designer can more easily design a connection between a conductor and a connector terminal without depending on the designer's experience and within a short period of time.

According to the invention, the compressibility estimation unit estimates the compressibility obtained after crimping in accordance with an input of known connection data, whereby the designer can ascertain a rough value of compressibility without actually connecting a conductor to a connector in accordance with the connection data. Further, the crimp width data produced by the C/W estimation unit and the crimp height data produced by the C/H estimation unit are input to the compressibility estimation unit as at least a portion of the known connection data required for estimating the compressibility, thereby obviating a necessity for the designer to estimate the crimp width and the crimp height and input the thus-estimated crimp width and the crimp height to the compressibility estimation unit. Consequently, there can be obtained a design support system capable of offering support so that any designer can more easily design a connection between a conductor and a connector terminal without depending on the designer's experience and within a short period of time.

According to the invention, the adhesion force estimation unit estimates the adhesion force to be achieved after crimping in accordance with an input of the known connection data, whereby the designer can ascertain a rough value of adhesion force which would be obtained after press-fitting, without actually connecting a conductor to a connector in accordance with the connection data. Further, the crimp width data produced by the C/W estimation unit, the crimp height data produced by the C/H estimation unit, and the compressibility data produced by the compressibility estimation unit are input to the adhesion force estimation unit as at least a portion of the known connection data required for estimating adhesion force. Since there is no necessity for the designer to estimate a crimp width, a crimp height, and compressibility and input the thus-estimated crimp width, crimp height, and compressibility to the adhesion force estimation unit, there can be obtained a design support system capable of offering support so that any designer can more easily design a connection between a conductor and a connector terminal without depending on the designer's experience and within a short period of time.

According to the invention, the resistance estimation unit estimates the contact resistance obtained after crimping in accordance with an input of the known connection data, whereby the designer can ascertain a rough value of contact resistance which would be obtained after press-fitting, without actually connecting a conductor to a connector in accordance with the connection data. Further, the crimp width data produced by the C/W estimation unit, the crimp height data produced by the C/H estimation unit, and the compressibility data produced by the compressibility estimation unit are input to the resistance estimation unit as at least a portion of the known connection data required for estimating contact resistance. Since there is no necessity for the designer to estimate a crimp width, a crimp height, and compressibility and input the thus-estimated crimp width, crimp height, and compressibility to the resistance estimation unit, there can be obtained a design support system capable of offering support so that any designer can more easily design a connection between a conductor and a connector terminal without depending on the designer's experience and within a short period of time.

According to the invention, the unknown connection data can be estimated through use of manually-input crimp width data. Hence, there can be obtained a design support system which is very easy to operate.

According to the invention, the sequential output unit automatically inputs the discrete values centered on the crimp height data produced by the C/H estimation unit without the designer entering the discrete values into the compressibility estimation unit, the adhesion force estimation unit, or the resistance estimation unit. Hence, there can be obtained a design support system capable of providing a more detailed connection characteristic.

According to the invention, the designer can ascertain a rough value of a slot width, that of a crimp height, that of load, that of withdrawal force, and that of contact resistance, which would be obtained after press-fitting, without actually connecting a conductor to a connector in accordance with the connection data. Consequently, there can be obtained a design support system capable of offering support so that any designer can more easily design a connection between a conductor and a connector terminal without depending on the designer's experience and within a short period of time.

According to the invention, the slot width estimation unit estimates the slot width to be obtained after press-fitting in accordance with an input of the known connection data, and the crimp height estimation unit estimates the crimp height to be obtained after press-fitting in accordance with an input of the known connection data, whereby the designer can ascertain a rough value of a slot width and a crimp height which would be obtained after press-fitting, without actually connecting a conductor to a connector in accordance with the connection data. Further, the slot width data produced by the slot width estimation unit are input to the adhesion force estimation unit as at least a portion of the known connection data required for estimating a crimp height. Since there is no necessity for the designer to estimate a crimp width and input the thus-estimated crimp width to the crimp height estimation unit, there can be obtained a design support system capable of offering support so that any designer can more easily design a connection between a conductor and a connector terminal without depending on the designer's experience and within a short period of time.

According to the invention, the load estimation unit estimates the load to be obtained after press-fitting in accordance with an input of the known connection data. As a result, the designer can ascertain a rough value of the load without actually connecting a conductor to a connector in accordance with the connection data. Further, the slot width data produced by the slot width estimation unit and the crimp height data produced by the crimp height estimation unit are input to the load estimation unit as at least a portion of the known connection data required for estimating the load, thereby obviating a necessity for the designer to estimate the slot width and the crimp height and input the thus-estimated slot width and the crimp height to the withdrawal force estimation unit. There can be obtained a design support system capable of offering support so that any designer can more easily design a connection between a conductor and a connector terminal without depending on the designer's experience and within a short period of time.

According to the invention, the withdrawal force estimation unit estimates the withdrawal force obtained after press-fitting in accordance with an input of known connection data. As a result, the designer can ascertain a rough value of the withdrawal force without actually connecting a conductor to a connector in accordance with the connection data. Further, the slot width data produced by the slot width estimation unit, the crimp height data produced by the crimp height estimation unit, and the load data produced by the load estimation unit are input to the withdrawal force estimation unit as at least a portion of the known connection data required for estimating the withdrawal force, thereby obviating a necessity for the designer to estimate the slot width, the crimp height, and the load and output the thus-estimated slot width, the crimp height, and the load to the load estimation unit. There can be obtained a design support system capable of offering support so that any designer can more easily design a connection between a conductor and a connector terminal without depending on the designer's experience and within a short period of time.

According to the invention, the resistance estimation unit estimates the contact resistance obtained after press-fitting in accordance with an input of known connection data. As a result, the designer can ascertain a rough value of the contact resistance without actually connecting a conductor to a connector in accordance with the connection data. Further, the slot width data produced by the slot width estimation unit, the crimp height data produced by the crimp height estimation unit, and the load data produced by the load estimation unit are input to the resistance estimation unit as at least a portion of the known connection data required for estimating the contact resistance, thereby obviating a necessity for the designer to estimate the slot width, the crimp height, and the load and input the thus-estimated slot width, the crimp height, and the load to the resistance estimation unit. There can be obtained a design support system capable of offering support so that any designer can more easily design a connection between a conductor and a connector terminal without depending on the designer's experience and within a short period of time.

According to the invention, the unknown connection data can be estimated through use of the manually-input slot width data. Hence, there can be obtained a design support system which is easy to operate.

According to the invention, the sequential output unit automatically inputs the discrete values centered on the crimp height data produced by the C/H estimation unit without the designer entering the discrete values centered on the crimp height data produced by the crimp height estimation unit into the load estimation unit, the withdrawal force estimation unit, or the resistance estimation unit. Hence, there can be obtained a design support system capable of providing a more detailed connection characteristic.

According to the invention, the sequential output unit automatically inputs the discrete values centered on the slot width data produced by the slot width estimation unit without the designer entering the discrete values into the crimp height estimation unit, the load estimation unit, the withdrawal force estimation unit, or the resistance estimation unit. Hence, there can be obtained a design support system capable of providing a more detailed connection characteristic.

According to the invention, the sequential output unit can automatically acquire the input known connection data and unknown connection data corresponding to discrete values centered on the input known connection data without the designer entering the connection data and the discrete values centered on the connection data. Hence, there can be obtained a design support system capable of providing a more detailed connection characteristic.

What is claimed is:

1. A design support system for supporting a design of a connection between a conductor and a connector terminal, comprising:
   an estimation unit which learns beforehand a relationship between known connection data pertaining to connection design and unknown connection data pertaining to the connection design for the known connection data,
   wherein the estimation unit estimates the unknown connection data pertaining to the known connection data in accordance with an input of the known connection data on the basis of the result of learning,
   wherein the estimation unit is constituted of a multilayer feedforward neural network in which layers formed of a plurality of neurons are coupled together in a direction in which the layers run from an input layer to an output layer by way of an intermediate layer, wherein, when the conductor and the connector terminal are connected together through crimping, the estimation unit performs learning beforehand while taking, as unknown connection data, any of a crimp width and a crimp height, a compressibility of the conductor in a direction of the crimp height, adhesion force existing between the conductor and the connector terminal, and contact resistance existing between the conductor and the connector terminal, which are obtained after crimping.

2. A design support system for supporting a design of a connection between a conductor and a connector terminal, comprising:

an estimation unit which learns beforehand a relationship between known connection data pertaining to connection design and unknown connection data pertaining to the connection design for the known connection data, wherein the estimation unit estimates the unknown connection data pertaining to the known connection data in accordance with an input of the known connection data on the basis of the result of learning, wherein the estimation unit is constituted of a multilayer feedforward neural network in which layers formed of a plurality of neurons are coupled together in a direction in which the layers run from an input layer to an output layer by way of an intermediate layer, wherein the estimation unit further comprises:

a C/W estimation unit which, when the conductor and the connector terminal are connected together by crimping, performs learning beforehand while taking the crimp width obtained after crimping as the unknown connection data and produces crimp width data by estimating the crimp width in accordance with an input of the known connection data required for estimating the crimp width; and a C/H estimation unit which performs learning beforehand while taking the crimp height obtained after crimping as the unknown connection data and produces crimp height data by estimating the crimp height in accordance with an input of the known connection data required for estimating the crimp height, wherein the crimp width data produced by the C/W estimation unit are input to the C/H estimation unit as at least a portion of the known connection data required for estimating the crimp height.

3. The design support system according to claim 2, wherein the estimation unit further comprises:

a compressibility estimation unit which performs learning beforehand while taking a compressibility of a conductor in the direction of a crimp height obtained after crimping as the unknown connection data and which estimates the compressibility in accordance with an input of the known connection data required for estimating the compressibility, wherein the crimp width data produced by the C/W estimation unit and the crimp height data produced by the C/H estimation unit are input to the compressibility estimation unit as at least a portion of the known connection data required for estimating the compressibility.

4. The design support system according to claim 3, wherein the estimation unit further comprises an adhesion force estimation unit which performs learning beforehand while taking adhesion force existing between the conductor and the connector terminal after crimping as the unknown connection data and which produces adhesion force data by estimating the adhesion force in accordance wit an input of the known connection data required for estimating the adhesion force, and the crimp width data produced by the C/W estimation unit, the crimp height data produced by the C/H estimation unit, and the compressibility data produced by the compressibility estimation unit are input to the adhesion force estimation unit as at least a portion of the known connection data required for estimating the adhesion force.

5. The design support system according to claim 3, wherein the estimation unit further comprises:

a resistance estimation unit which performs learning beforehand while taking contact resistance existing between the conductor and the connector terminal after crimping as the unknown connection data and which produces contact resistance data by estimating the contact resistance in accordance with an input of the known connection data required for estimating the contact resistance, wherein the crimp width data produced by the C/W estimation unit, the crimp height data produced by the C/H estimation unit, and the compressibility data produced by the compressibility estimation unit are input to the resistance estimation unit as at least a portion of the known connection data required for estimating the contact resistance.

6. The design support system according to claim 2, further comprising an input unit for manually inputting crimp width data to be input to the estimation unit as the known connection data so as to become equal to the crimp width data produced by the C/H estimation unit.

7. The design support system according to claim 3, further comprising:

a sequential output unit which sequentially outputs, as the crimp height data, the crimp height data and a predetermined number of discrete values existing in a predetermined range centered on the crimp height data in accordance with an input of the crimp height data produced by the C/H estimation unit.

8. A design support system for supporting a design of a connection between a conductor and a connector terminal, comprising:

an estimation unit which learns beforehand a relationship between known connection data pertaining to connection design and unknown connection data pertaining to the connection design for the known connection data, wherein the estimation unit estimates the unknown connection data pertaining to the known connection data in accordance with an input of the known connection data on the basis of the result of learning, wherein the estimation unit is constituted of a multilayer feedforward neural network in which layers formed of a plurality of neurons are coupled together in a direction in which the layers run from an input layer to an output layer by way of an intermediate layer, wherein, when the conductor sheathed with an insulation cladding is connected to a slot formed in the connector terminal through press-fitting, the estimation unit performs learning beforehand while any of the slot width obtained before press-fitting, a crimp height representing a height from a base of the slot to the center of the conductor obtained after press fitting, load exerted on the conductor, withdrawal force exerted between the conductor and the connector terminal, and contact resistance existing between the conductor and the connector is taken as unknown connection data.

9. A design support system for supporting a design of a connection between a conductor and a connector terminal, comprising:
   an estimation unit which learns beforehand a relationship between known connection data pertaining to connection design and unknown connection data pertaining to the connection design for the known connection data,
   wherein the estimation unit estimates the unknown connection data pertaining to the known connection data in accordance with an input of the known connection data on the basis of the result of learning,
   wherein the estimation unit is constituted of a multilayer feedforward neural network in which layers formed of a plurality of neurons are coupled together in a direction in which the layers run from an input layer to an output layer by way of an intermediate layer,
   wherein, when the conductor sheathed with an insulation cladding is connected to and press-fitted into a slot formed in the connector terminal, the estimation unit further comprises:
   a slot width estimation unit which performs learning beforehand while taking the slot width obtained before press-fitting as the unknown connection data and which produces slot width data by estimating the slot width in accordance with an input of the known connection data required for estimating the slot width; and
   a crimp height estimation unit which performs learning beforehand while taking the crimp height from the base of the slot to the center of the conductor obtained after press-fitting as the unknown connection data and produces crimp height data by estimating the crimp height in accordance with an input of the known connection data required for estimating the crimp height, wherein the slot width data produced by the slot width estimation unit are input to the crimp height estimation unit as at least a portion of the known connection data required for estimating the crimp height.

10. The design support system according to claim 9, wherein
   the estimation unit further comprises a load estimation unit which performs learning beforehand while taking load exerted on the conductor after press-fitting as the unknown connection data and which produces load data by estimating the load in accordance with an input of the known connection data required for estimating the load, and
   the slot width data produced by the slot width estimation unit and the crimp height data produced by the crimp height estimation unit are input to the load estimation unit as at least a portion of the known connection data required for estimating no load.

11. The design support system according to claim 10, wherein
   the estimation unit further comprises a withdrawal force estimation which performs learning beforehand while taking withdrawal force exerted between the conductor and the connector terminal after press-fitting as the unknown connection data and which produces withdrawal force data by estimating the withdrawal force in accordance with an input of the known connection data required for estimating the withdrawal force, and
   the slot width data produced by the slot width estimation unit, the crimp height data produced by the crimp height estimation unit, and the load data produced by the load estimation unit are input to the withdrawal force estimation unit as at least a portion of the known connection data required for estimating the withdrawal force.

12. The design support system according to claim 10, wherein
   the estimation unit further comprises a resistance estimation unit which performs learning beforehand while taking contact resistance existing between the conductor and the connector terminal after press-fitting as the unknown connection data and which produces contact resistance data by estimating the contact resistance in accordance with an input of the known connection data required for estimating the contact resistance, and
   the slot width data produced by the slot width estimation unit, the crimp height data produced by the crimp height estimation unit, and the load data produced by the load estimation unit are input to the resistance estimation unit as at least a portion of the known connection data required for estimating the contact resistance.

13. The design support system according to claim 9, further comprising:
   an input unit for manually inputting slot width data to be input to the estimation unit as the known connection data so as to become equal to the slot width data produced by the slot width estimation unit.

14. The design support system according to claim 10, further comprising:
   a sequential output unit which sequentially outputs, as the crimp height data, the crimp height data and a predetermined number of discrete values existing in a predetermined range centered on the crimp height data in accordance with an input of the crimp height data produced by the crimp height estimation unit.

15. The design support system according to claim 9, further comprising a sequential output unit which sequentially outputs, as the slot width data, the slot width data and a predetermined number of discrete values existing in a predetermined range centered on the slot width data in accordance with an input of the slot width data produced by the slot width estimation unit.

16. A design support system for supporting a design of a connection between a conductor and a connector terminal, comprising:
   an estimation unit which learns beforehand a relationship between known connection data pertaining to connection design and unknown connection data pertaining to the connection design for the known connection data,
   a sequential output unit which sequentially outputs, as the known connection data, the known connection data and a predetermined number of discrete values existing in a predetermined range centered on the known connection data in accordance with an input of the connection data,
   wherein the estimation unit estimates the unknown connection data pertaining to the known connection data in accordance with an input of the known connection data on the basis of the result of learning,
   wherein the estimation unit is constituted of a multilayer feedforward neural network in which layers formed of a plurality of neurons are coupled together in a direction in which the layers run from an input layer to an output layer by way of an intermediate layer.

* * * * *